US012217997B2

United States Patent
Clarke et al.

(10) Patent No.: US 12,217,997 B2
(45) Date of Patent: Feb. 4, 2025

(54) CLEANROOM COMPATIBLE ROBOTIC END EFFECTOR EXCHANGE SYSTEM

(71) Applicant: KLA CORPORATION, Milpitas, CA (US)

(72) Inventors: Benjamin James Thomas Clarke, Milpitas, CA (US); Asaf Wiseman, Milpitas, CA (US); Tzachi Pressburger, Milpitas, CA (US); Michael Brisman, Milpitas, CA (US); Joseph A. Di Regolo, Milpitas, CA (US)

(73) Assignee: KLA CORPORATION, Milpitas, CA (US)

( * ) Notice: Subject to any disclaimer, the term of this patent is extended or adjusted under 35 U.S.C. 154(b) by 87 days.

(21) Appl. No.: 18/156,131

(22) Filed: Jan. 18, 2023

(65) Prior Publication Data

US 2023/0298926 A1 Sep. 21, 2023

Related U.S. Application Data

(60) Provisional application No. 63/307,247, filed on Feb. 7, 2022, provisional application No. 63/477,761, filed on Dec. 29, 2022.

(51) Int. Cl.
*H01L 21/68* (2006.01)
*B25J 15/04* (2006.01)
(Continued)

(52) U.S. Cl.
CPC .... *H01L 21/68707* (2013.01); *B25J 15/0433* (2013.01); *B25J 15/0491* (2013.01);
(Continued)

(58) Field of Classification Search
CPC ............ H01L 21/68707; B25J 15/0433; B25J 15/0491; B25J 15/0425; B25J 15/0408; B25J 19/0075; B25J 11/0095; G01B 11/06
See application file for complete search history.

(56) References Cited

U.S. PATENT DOCUMENTS

| 7,085,622 B2 * | 8/2006 | Sadighi | H01L 21/681 348/94 |
| 9,254,566 B2 * | 2/2016 | Hashimoto | B25J 9/042 |

(Continued)

FOREIGN PATENT DOCUMENTS

| CN | 112151432 A | * 12/2020 | ...... H01L 21/67742 |
| DE | 102006058952 A1 | * 6/2008 | ...... H01L 21/67766 |

(Continued)

OTHER PUBLICATIONS

ATI Industrial Automation, "Automatic / Robotic Tool Changers," retrieved from the internet: <https://www.ati-ia.com/products/toolchanger/robot_tool_changer.aspx>, Feb. 2, 2022.

(Continued)

*Primary Examiner* — Bayan Salone
(74) *Attorney, Agent, or Firm* — Hodgson Russ LLP

(57) ABSTRACT

The system includes a robot interface disposed on a robot arm, and an end effector configured to selectively couple to the robot arm via the robot interface. The end effector includes an upper jaw, a lower jaw, and a pair of arms configured to carry a substrate. The upper jaw and the lower jaw are spaced apart in a first direction and biased together, and the pair of arms are spaced apart in a second direction orthogonal to the first direction. When the end effector is coupled to the robot arm, the robot interface is disposed between the upper jaw and the lower jaw. To exchange the (Continued)

end effector, the upper jaw and the lower jaw can be separated to release the robot interface.

9 Claims, 15 Drawing Sheets

(51) Int. Cl.
 *B25J 19/00* (2006.01)
 *G01B 11/06* (2006.01)
 *H01L 21/687* (2006.01)
(52) U.S. Cl.
 CPC ......... *B25J 19/0075* (2013.01); *G01B 11/06* (2013.01); *Y10T 29/49947* (2015.01)

(56) References Cited

U.S. PATENT DOCUMENTS

| | | | | |
|---|---|---|---|---|
| 10,005,190 | B2* | 6/2018 | Ha | H01L 21/68707 |
| 10,576,639 | B2 | 3/2020 | Bosboom et al. | |
| 10,717,187 | B2* | 7/2020 | Iqtidar | B25J 9/042 |
| 10,940,594 | B2* | 3/2021 | Hosek | B25J 9/042 |
| 12,042,930 | B2* | 7/2024 | Bosboom | B25J 15/0014 |
| 2005/0110287 | A1* | 5/2005 | Florindi | H01L 21/68707 |
| | | | | 294/2 |
| 2016/0067869 | A1* | 3/2016 | Hosek | B25J 9/042 |
| | | | | 414/744.7 |
| 2016/0158943 | A1* | 6/2016 | Ha | H01L 21/68707 |
| | | | | 901/29 |
| 2016/0346923 | A1* | 12/2016 | Kesil | B25J 9/1612 |
| 2022/0143843 | A1* | 5/2022 | Bosboom | B25J 15/0014 |

FOREIGN PATENT DOCUMENTS

| | | | | |
|---|---|---|---|---|
| JP | H07115201 | B2 | 12/1995 | |
| JP | H09174474 | A | 7/1997 | |
| JP | 5130509 | B2 * | 1/2013 | |
| KR | 102322129 | B1 * | 6/2019 | |
| KR | 20190106906 | A * | 8/2019 | B25J 15/0408 |
| TW | I726219 | B | 5/2021 | |
| WO | WO-2010136961 | A1 * | 12/2010 | B25J 9/1661 |
| WO | WO-2022004528 | A1 * | 1/2022 | |
| WO | WO-2022051751 | A1 * | 3/2022 | B25J 19/021 |

OTHER PUBLICATIONS

WIPO, International Search Report for International Application No. PCT/US2023/011914, May 24, 2023.

WIPO, Written Opinion of the International Searching Authority for International Application No. PCT/US2023/011914, May 24, 2023.

\* cited by examiner

CLEANROOM COMPATIBLE ROBOTIC END EFFECTOR EXCHANGE SYSTEM

CROSS-REFERENCE TO RELATED APPLICATIONS

This application claims priority to the provisional patent application filed Feb. 7, 2022 and assigned U.S. App. No. 63/307,247, and the provisional patent application filed Dec. 29, 2022 and assigned U.S. App. No. 63/477,761, the entire disclosures of which are hereby incorporated by reference.

FIELD OF THE DISCLOSURE

This disclosure relates to robotic arms and, more particularly, to an end effector for a robotic arm.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Between the various fabrication processes and inspection processes, a substrate may be transported using a robot arm. An end effector connected to the robot arm may be specifically shaped to perform various tasks and carry certain objects. However, existing end effectors are generally very bulky, and are configured to carry objects much larger and/or heavier than a semiconductor substrate. Existing end effectors are also generally limited in use with compatible robot arm manufacturers. Consequently, redesign of semiconductor fabrication and inspection systems is required in order to accommodate these end effectors.

Various steps in the fabrication and inspection processes may require different end effectors to handle the substrate. Thus, it may be desirable to quickly switch between end effectors connected to the robot arm. However, the large mass of existing end effectors require an equally strong tool changer, and a larger footprint to accommodate. Furthermore, existing tool changers are not clean room compatible, and may cause contamination to the system and the substrate.

Therefore, what is needed is an end effector and tool exchange system for carrying semiconductor substrates that is lightweight, compact, robot agnostic, externally actuated, and cleanroom compatible.

BRIEF SUMMARY OF THE DISCLOSURE

An embodiment of the present disclosure provides a system comprising a robot interface disposed on a robot arm, and an end effector configured to selectively couple to the robot arm via the robot interface. The end effector may comprise an upper jaw, a lower jaw, and a pair of arms configured to carry a substrate. The upper jaw and the lower jaw may be spaced apart in a first direction and biased together, and the pair of arms may be spaced apart in a second direction orthogonal to the first direction. When the end effector is coupled to the robot arm, the robot interface may be disposed between the upper jaw and the lower jaw.

According to an embodiment of the present disclosure, the end effector may further comprise a spring connected to the upper jaw and the lower jaw. The spring may be pre-loaded to urge the upper jaw and the lower jaw together.

According to an embodiment of the present disclosure, a first kinematic coupling may be provided between an upper surface of the lower jaw and a lower surface of the robot interface. A second kinematic coupling may be provided between a lower surface of the upper jaw and an upper surface of the robot interface. The first kinematic coupling and the second kinematic coupling may engage the robot interface with the upper jaw and the lower jaw when the robot interface is disposed between the upper jaw and the lower jaw.

According to an embodiment of the present disclosure, the end effector may further comprise a plunger and the robot interface may further comprises a plunger socket. When the end effector is coupled to the robot arm, the plunger may be coupled to the plunger socket. The plunger may be movable in an axial direction by the robot arm to selectively couple to the plunger socket.

According to an embodiment of the present disclosure, the system may further comprise a tool exchanger comprising a pair of grip arms. The pair of grip arms may be configured to separate the upper jaw and the lower jaw. The tool exchanger may be disposed in a garage, and when the end effector is positioned in the garage, the pair of grip arms may be configured to separate the upper jaw and the lower jaw. An optical sensor may be disposed in the garage, which may be configured to detect when the end effector is positioned in the garage. A measurement sensor may be disposed in the garage, which may be configured to detect a thickness of the end effector.

Another embodiment of the present disclosure provides a method. The method may comprise: disposing a robot interface on a robot arm; selectively coupling an end effector to the robot arm via the robot interface; and disposing a substrate on a pair of arms of the end effector. The end effector may comprise an upper jaw and a lower jaw that may be spaced apart in a first direction and biased together, and the pair of arms may be spaced apart in a second direction orthogonal to the first direction. When the end effector is coupled to the robot arm, the robot interface may be disposed between the upper jaw and the lower jaw.

According to an embodiment of the present disclosure, selectively coupling an end effector to the robot arm via the robot interface may comprise: separating the upper jaw and the lower jaw with a tool exchanger comprising a pair of grip arms; inserting the robot interface between the upper jaw and the lower jaw; and closing the upper jaw and the lower jaw onto the robot interface.

According to an embodiment of the present disclosure, the tool exchanger may be disposed in a garage, and separating the upper jaw and the lower jaw with an tool exchanger comprising a pair of grip arms may comprise: separating the upper jaw and the lower jaw with the pair of grip arms when the end effector is positioned in the garage.

According to an embodiment of the present disclosure, the method may further comprise detecting, by an optical sensor, when the end effector is positioned in the garage.

According to an embodiment of the present disclosure, the method may further comprise detecting, by a measurement sensor, a thickness of the end effector positioned in the garage.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process, step, and electronic changes may be made without departing from the scope of the disclosure. Accordingly, the scope of the disclosure is defined only by reference to the appended claims.

Referring to FIGS. 1-5, an embodiment of the present disclosure provides a system 100. The system 100 may comprise a robot arm 110. The robot arm 110 may be movable in six degrees of freedom within a robot envelope. The size and shape of the robot envelope may depend on the particular structure of the robot arm 110 (e.g., the lengths of the arms, number of joints, etc.), and is not limited herein. The robot arm 110 can comprise any number of links, joints, or tracks and any rotary or linear actuator mechanisms to allow the robot arm 110 to have appropriate degrees of freedom, range, and space for a particular application. It should be understood that the phrase "robot arm" as used herein may refer to any part of a robotic system and need not be embodied as an "arm."

The system 100 may further comprise a robot interface 120. The robot interface 120 may be made of an appropriate material of weight, strength, and stiffness for a particular application. For example, the robot interface 120 may be made of aluminum, titanium, ceramic, carbon fiber, steel, or other materials. The robot interface 120 may be disposed on the robot arm 110. For example, the robot interface 120 may be disposed on a distal end of the robot arm 110. It should be understood that the manner in which the robot interface 120 is disposed on and/or secured to the robot arm 110 may depend on the particular structure of the robot arm 110, and is not limited herein. For example, the robot interface 120 may be attached onto a set of locating features or a flange with axial/rotational locking features of the robot arm 110 and secured with three or more bolts or welding. The robot interface 120 may be an integral part of the robot arm 110, or a portion of the robot arm 110 may be replaced with the robot interface 120.

Figure 3A:
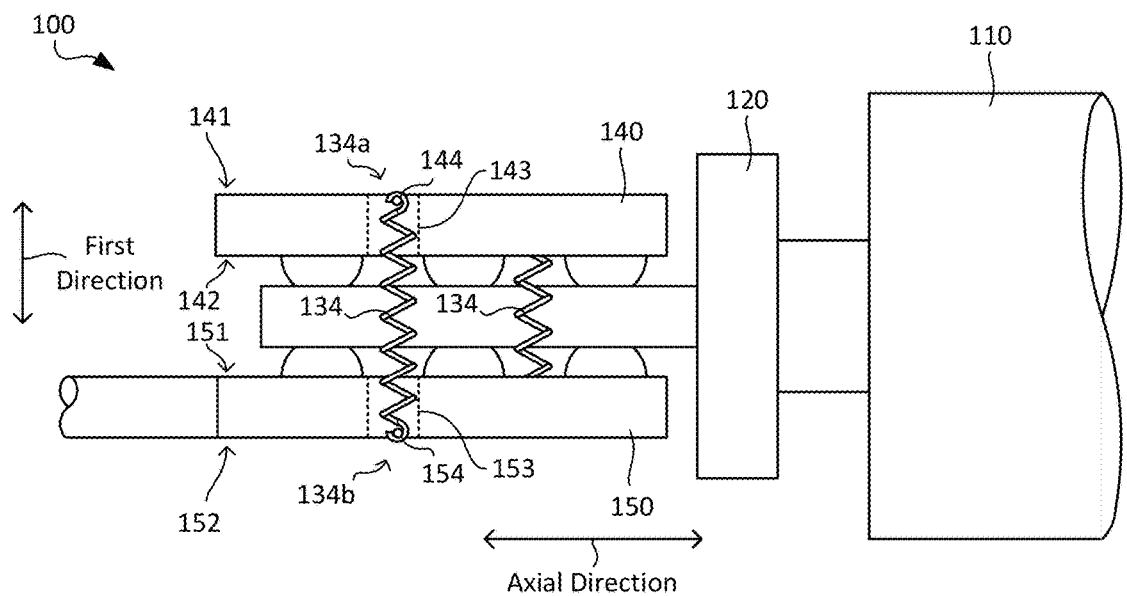
FIG. 3A is a side view of the end effector and robot interface of FIG. 2A coupled to each other.
Figure 3B:
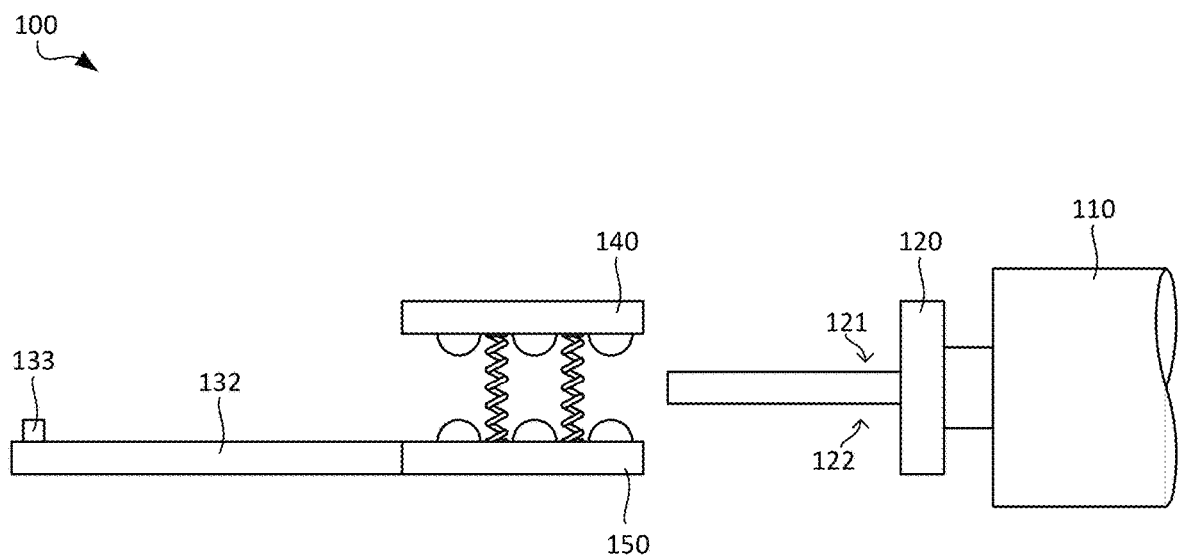
FIG. 3B is a side view of the end effector and robot interface of FIG. 3A uncoupled from each other.

The system 100 may further comprise an end effector 130. The end effector 130 may be made of an appropriate material of weight, strength, and stiffness for a particular application. For example, the end effector 130 may be made of aluminum, titanium, ceramic, carbon fiber, steel, or other materials. The end effector 130 may be configured to selectively couple to the robot arm 110 via the robot interface 120. The end effector 130 may comprise an upper jaw 140 and a lower jaw 150, as shown in FIGS. 3A and 3B. The upper jaw 140 and the lower jaw 150 may be spaced apart in a first direction. The upper jaw 140 and the lower jaw 150 may be biased together. When the end effector 130 is coupled to the robot arm 110, the robot interface 120 may be disposed between the upper jaw 140 and the lower jaw 150.

Figure 2A:
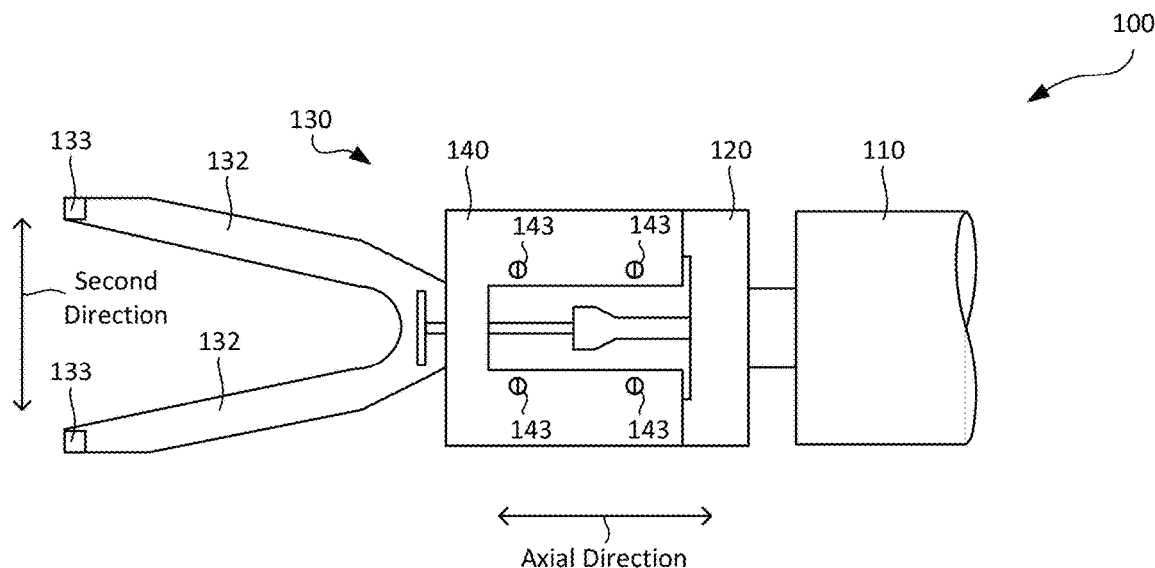
FIG. 2A is a top view of an end effector coupled to a robot interface according to an embodiment of the present disclosure.
Figure 2B:
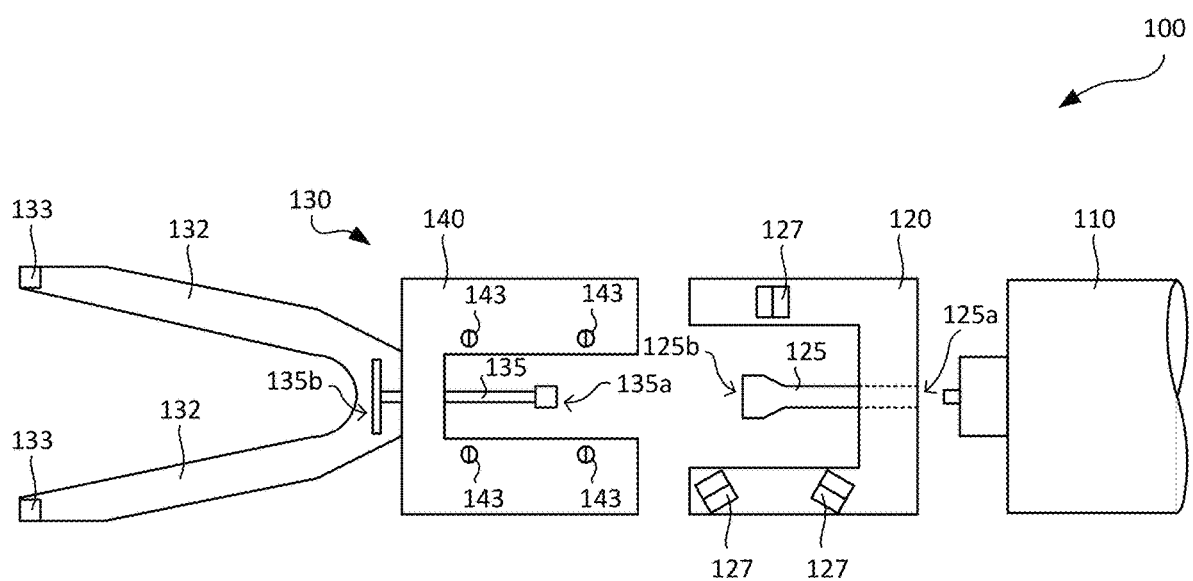
FIG. 2B is a top view of the end effector and robot interface of FIG. 2A uncoupled from each other.

The end effector 130 may further comprise a pair of arms 132, as shown in FIGS. 2A and 2B. The pair of arms 132 may be integrally formed with the upper jaw 140 and/or the lower jaw 150. The pair of arms 132 may be configured to carry a substrate 101. The substrate 101 may have a circular or rectangular shape. The pair of arms 132 may be spaced apart in a second direction. The second direction may be orthogonal to the first direction. The pair of arms 132 may include one or more protrusions 133 configured to contact the substrate 101. The one or more protrusions 133 may be comprised of an elastomeric material and may provide grip when contacting the substrate 101. The one or more protrusions 133 may have a hook-like structure or an angular surface forming an acute angle to provide a force vector to press the substrate 101 onto the pair of arms 132. It should be understood that the end effector 130 may alternatively comprise structures other than the pair of arms 132 configured to carry the substrate 101. Such structures may be any shape such as a T-shape, web-like structure, solid plate, or other structures.

The end effector 130 may further comprise a spring 134 connected to the upper jaw 140 and the lower jaw 150. For example, as shown in FIG. 3A, a first end 134a of the spring 134 may be connected to the upper jaw 140, and a second end 134b of the spring 134 may be connected to the lower jaw 150. The spring 134 may be disposed in and upper guide 143 of the upper jaw 140 and a lower guide 153 of the lower jaw 150. The upper guide 143 and the lower guide 153 may be cylindrical channels extending through the upper jaw 140 and the lower jaw 150, respectively. The upper guide 143 may include an upper transverse rod 144 across the upper guide 143 on the upper surface 141 of the upper jaw 140, and the lower guide 153 may include a lower transverse rod 154 across the lower guide 153 on the lower surface 152 of the lower jaw 150. The first end 134a of the spring 134 may be connected to the upper transverse rod 144 and the second end 134b of the spring may be connected to the lower transverse rod 154. For example, the first end 134a and the second end 134b of the spring may have a hook or ring shape that may loop around the upper transverse rod 144 and the lower transverse rod 154, respectively. The spring 134 may be pre-loaded to urge the upper jaw 140 and the lower jaw together 150. In other words, a distance between the lower surface 142 of the upper jaw 140 and the upper surface 151 of the lower jaw 150 may be less than a free length of the spring 134. In this way, the spring 134 may urge the upper jaw 140 and the lower jaw 150 together.

Figure 4A:
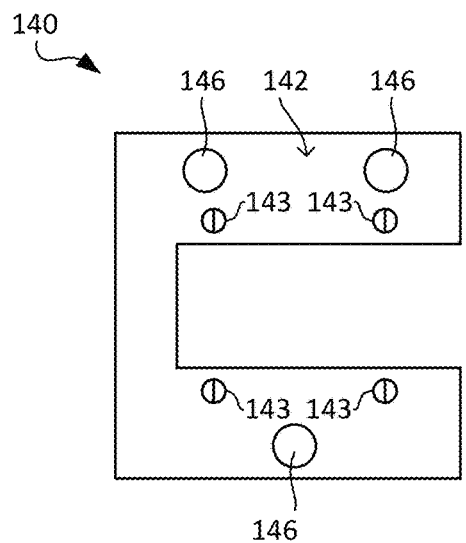
FIG. 4A is a bottom view of an upper jaw of the end effector of FIG. 2A.
Figure 4B:
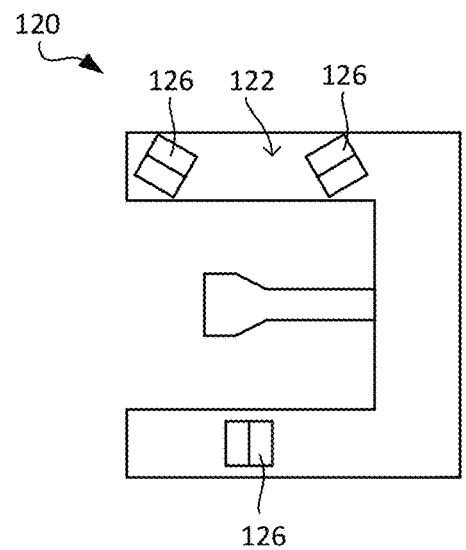
FIG. 4B is a bottom view of the end effector of FIG. 2A.
Figure 4C:
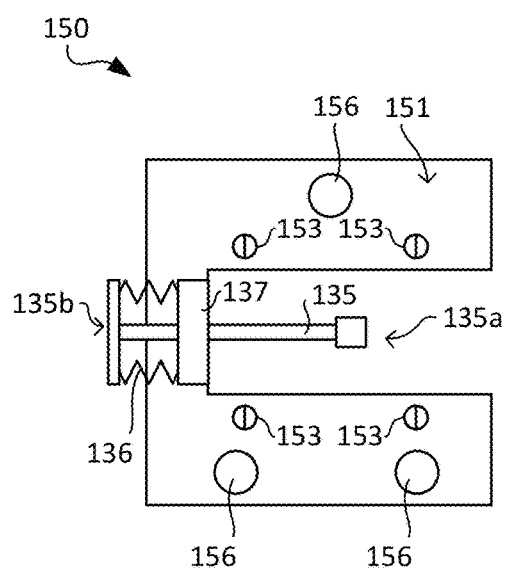
FIG. 4C is a top view of a lower jaw of the end effector of FIG. 2A.
Figure 4D:
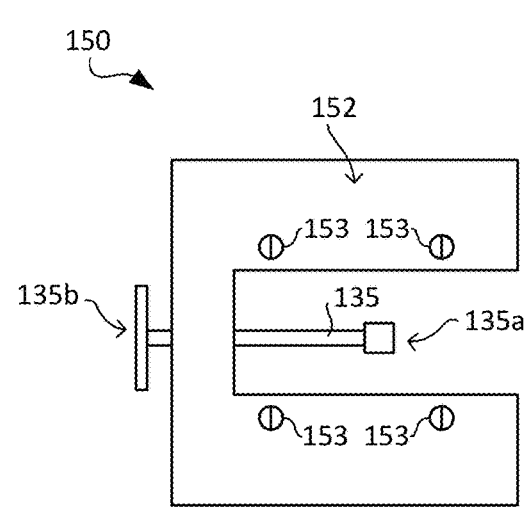
FIG. 4D is a bottom view of the lower jaw of FIG. 4C.

According to an embodiment of the present disclosure, the end effector 130 may comprise four springs 134 connected to the upper jaw 140 and the lower jaw 150. Each spring 134 may be disposed in a respective upper guide 143 and lower guide 153, and may have a first end 134a connected an upper transverse rod 144 and a second end 134b connected to a lower transverse rod 154 disposed in each upper guide 143 and lower guide 153, respectively. The four springs 134 may be arranged in a square or rectangular shape, as shown in FIGS. 4A, 4C, and 4D.

The system 100 may further comprise one or more kinematic couplings. The kinematic couplings may engage one another when the end effector 130 is coupled to the robot arm 110 via the robot interface 120. When the kinematic couplings are engaged, the end effector 130 and the robot interface 120 may be prevented from moving relative to one another (i.e., the end effector 130 and the robot interface 120 may be constrained in all six degrees of freedom). The one or more kinematic couplings may include contacts between a conical, spherical, hemispherical, cylindrical, or canoe-shaped feature of one of the end effector 130 and the robot interface 120 and a tetrahedral groove, a cone-shaped groove, a v-shaped groove, or a flat groove of the other of the end effector 130 and the robot interface 120. It should be understood that in order to constrain all six degrees of freedom, the kinematic couplings may provide at least six contact points between the end effector 130 and the robot interface 120. The six contact points may be established by a combination of one or more of a tetrahedral groove (three contact points), a v-shaped groove (two contact points), or a flat groove (one contact point). Alternatively, the kinematic couplings may provide an annular contact between the end effector 130 and the robot interface 120 with a cone-shaped groove.

A first kinematic coupling may be provided between an upper surface 151 of the lower jaw 150 and a lower surface 122 of the robot interface 120. For example, one or more spherical structures 156 may be disposed on the upper surface 151 of the lower jaw 150 (as shown in FIG. 4C), and one or more v-shaped grooves 126 may be disposed on the lower surface 122 of the robot interface 120 (as shown in FIG. 4B). In an embodiment, the first kinematic coupling may be defined by three spherical structures 156 and three v-shaped groves 126, where each of the three spherical structures 156 are aligned (in the axial direction and the second direction) with a respective one of the three v-shaped grooves 126. Thus, when the end effector 130 is coupled to the robot arm 110 via the robot interface 120, the first kinematic coupling may provide six contact points (i.e., two contact points per pair of spherical structure 156 and v-shaped groove 126) to constrain all six degrees of freedom. The three spherical structures 156 and the three v-shaped grooves 126 may be arranged in a triangle. For example, two of the spherical structures 156 and two of the v-shaped grooves 126 may be disposed on one side of the lower jaw 150 and the robot interface 120, respectively, and the other of the spherical structures 156 and the v-shaped grooves 126 may be disposed on the other side of the lower jaw 150 and the robot interface 120, respectively. The three v-shaped grooves 126 may be angled relative to one another. For example, the three v-shaped grooves 126 may be angled about 120° relative to one another. While the spherical structures 156 and v-shaped grooves 126 are described as being parts of the lower jaw 150 and robot interface 120, respectively, the opposite arrangement (i.e., where the lower jaw 150 having v-shaped grooves and the robot interface 120 having spherical structures) is also believed to be within the scope of the present disclosure.

A second kinematic coupling may be provided between a lower surface 142 of the upper jaw 140 and an upper surface 121 of the robot interface 120. For example, one or more spherical structures 146 may be disposed on the lower surface 142 of the upper jaw 140 (as shown in FIG. 4A), and one or more v-shaped grooves 127 may be disposed on the upper surface 121 of the robot interface 120 (as shown in FIG. 2B). In an embodiment, the second kinematic coupling may be defined by three spherical structures 146 and three v-shaped grooves 127, where each of the three spherical structures 146 are aligned (in the axial direction and the second direction) with a respective one of the three v-shaped grooves 127. Thus, when the end effector 130 is coupled to the robot arm 110 via the robot interface 120, the second kinematic coupling may provide six contact points (i.e., two contact points per pair of spherical structure 146 and v-shaped groove 127) to constrain all six degrees of freedom. The three spherical structures 146 and the three v-shaped grooves 127 may be arranged in a triangle. For example, two of the spherical structures 146 and two of the v-shaped grooves 127 may be disposed on one side of the upper jaw 140 and the robot interface 120, respectively, and the other of the spherical structures 146 and the v-shaped grooves 127 may be disposed on the other side of the upper jaw 140 and the robot interface 120, respectively. The three v-shaped grooves 127 may be angled relative to one another. For example, the three v-shaped grooves 127 may be angled about 120° relative to one another. While the spherical structures 146 and v-shaped grooves 127 are described as being parts of the upper jaw 140 and robot interface 120, respectively, the opposite arrangement (i.e., where the upper jaw 140 having v-shaped grooves and the robot interface 120 having spherical structures) is also believed to be within the scope of the present disclosure.

According to an embodiment of the present disclosure, the system 100 may comprise both the first kinematic coupling and the second kinematic coupling described above. Thus, when the end effector 130 is coupled to the robot arm 110 via the robot interface 120, the first kinematic coupling and the second kinematic coupling may each provide six contact points (i.e., two contact points per pair of spherical structure 156 and v-shaped groove 126 and two contact points per pair of spherical structure 146 and v-shaped groove 127) to constrain all six degrees of freedom. The first kinematic coupling and the second kinematic coupling may be aligned relative to one another. For example, each of the spherical structures 156 of the lower jaw 150, the spherical structures 146 of the upper jaw 140, and the v-shaped grooves 126 and the v-shaped grooves 127 of the robot interface 120 may be aligned in the first direction and the second direction. Alternatively, the first kinematic coupling and the second kinematic coupling may be not aligned relative to each other. For example, the pairs of spherical structures 156 and v-shaped grooves 126 of the first kinematic coupling may not be aligned in the first direction and/or the second direction with the pairs of spherical structure 146 and v-shaped grooves 127 of the second kinematic coupling. In an embodiment, the first kinematic coupling and the second kinematic coupling may be arranged opposite to one another. For example, the locations of the pairs of spherical structures 156 and v-shaped grooves 126 of the first kinematic coupling may be mirror images of the locations of the pairs of spherical structure 146 and v-shaped grooves 127 of the second kinematic coupling. Thus, the first kinematic coupling and the second kinematic coupling may properly engage when the robot interface 120 is flipped on either side (i.e., such that the spherical structures 156 and the spherical structures 146 can contact the v-shaped grooves 126 or the v-shaped grooves 127 in both orientations).

Referring to FIGS. 2A and 2B, the end effector 130 may further comprise a plunger 135. The plunger 135 may be centrally disposed in the end effector 130 in the second direction. The plunger 135 may have a first end 135a and a second end 135b. The robot interface 120 may further comprise a plunger socket 125. The plunger socket 125 may have a first end 125a and a second end 125b. When the end effector 130 is coupled to the robot arm 110 via the robot interface 120, the plunger 135 may be coupled to the plunger socket 125. For example, the first end 135a of the plunger 135 may be coupled to the second end 125b of the plunger socket 125. The robot arm 110 may be configured to move the coupled plunger 135 and plunger socket 125 in an axial direction using a pneumatic actuator or other mechanism. For example, the robot arm 110 may interact with the first end 125a of the plunger socket 125 to move the coupled plunger 135 and plunger socket 125 in the axial direction. The second end 135b of the plunger 135 may be configured to contact the substrate 101 disposed on the end effector 130. Thus, by moving the coupled plunger 135 and plunger socket 125 in the axial direction, the second end 135b of the plunger 135 may press against the substrate 101 and hold the substrate on the end effector 130. The second end 135b of the plunger 135 may be comprised of an elastomeric material and may provide grip when contacting the substrate 101. The robot arm 110 may also be configured to retract the coupled plunger 135 and plunger socket 125 in order to release the grip on the substrate 101. The end effector 130 may comprise a preload spring 136 configured to bias the plunger 135 toward a retracted position to assist retraction of the coupled plunger 135 and plunger socket 125 by the robot arm 110. Alternatively, the robot arm 110 may be configured to retract the coupled plunger 135 and plunger socket 125 unassisted. The plunger 135 may be disposed in a bushing 137 arranged on the upper surface 151 of the lower jaw 150.

Figure 5A:
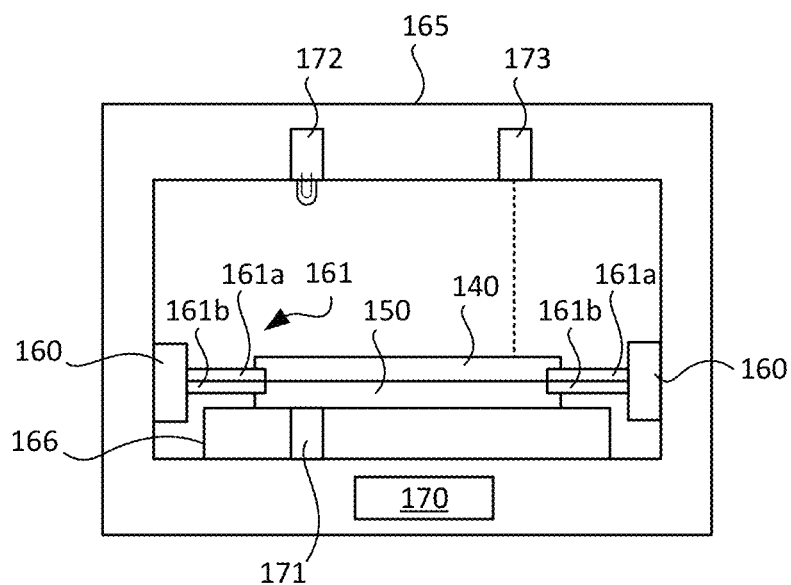
FIG. 5A illustrates a garage storing an end effector according to an embodiment of the present disclosure.
Figure 5B:
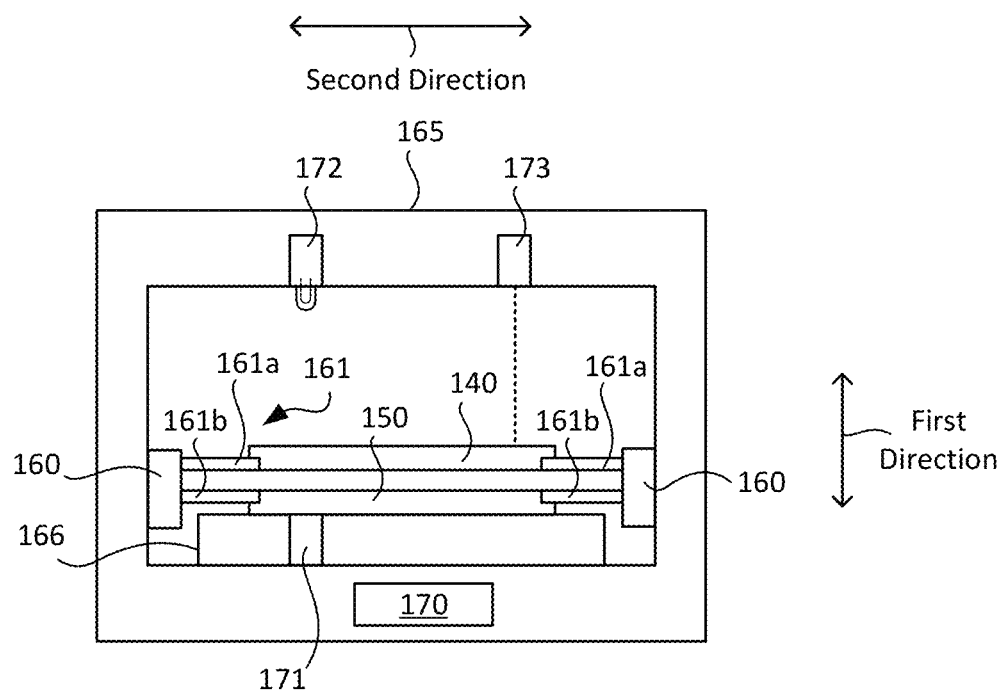
FIG. 5B illustrates a tool exchanger separating an upper jaw and lower jaw of the end effector of FIG. 5A.

Referring to FIGS. 5A and 5B, the system 100 may further comprise a tool exchanger 160. The tool exchanger 160 may comprise a pair of grip arms 161. The pair of grip arms 161 may comprise an upper grip arm 161a and a lower grip arm 161b. The upper grip arm 161a and the lower grip arm 161b may be configured to separate the upper jaw 140 and the lower jaw 150. For example, an upper grip arm 161a may contact the lower surface 142 of the upper jaw 140, and a lower grip arm 161b may contact an upper surface 151 of the lower jaw 150. Thus, when the pair of grip arms 161 separate the upper jaw 140 and the lower jaw 150, the robot interface 120 may be withdrawn from (or received in) the end effector 130, thereby providing effective tool exchanging. The tool exchanger 160 may comprise a single pair of grip arms 161 disposed on one side of the end effector 130 or may comprise two pairs of grip arms 161 disposed on opposite sides of the end effector 130.

Figure 1:
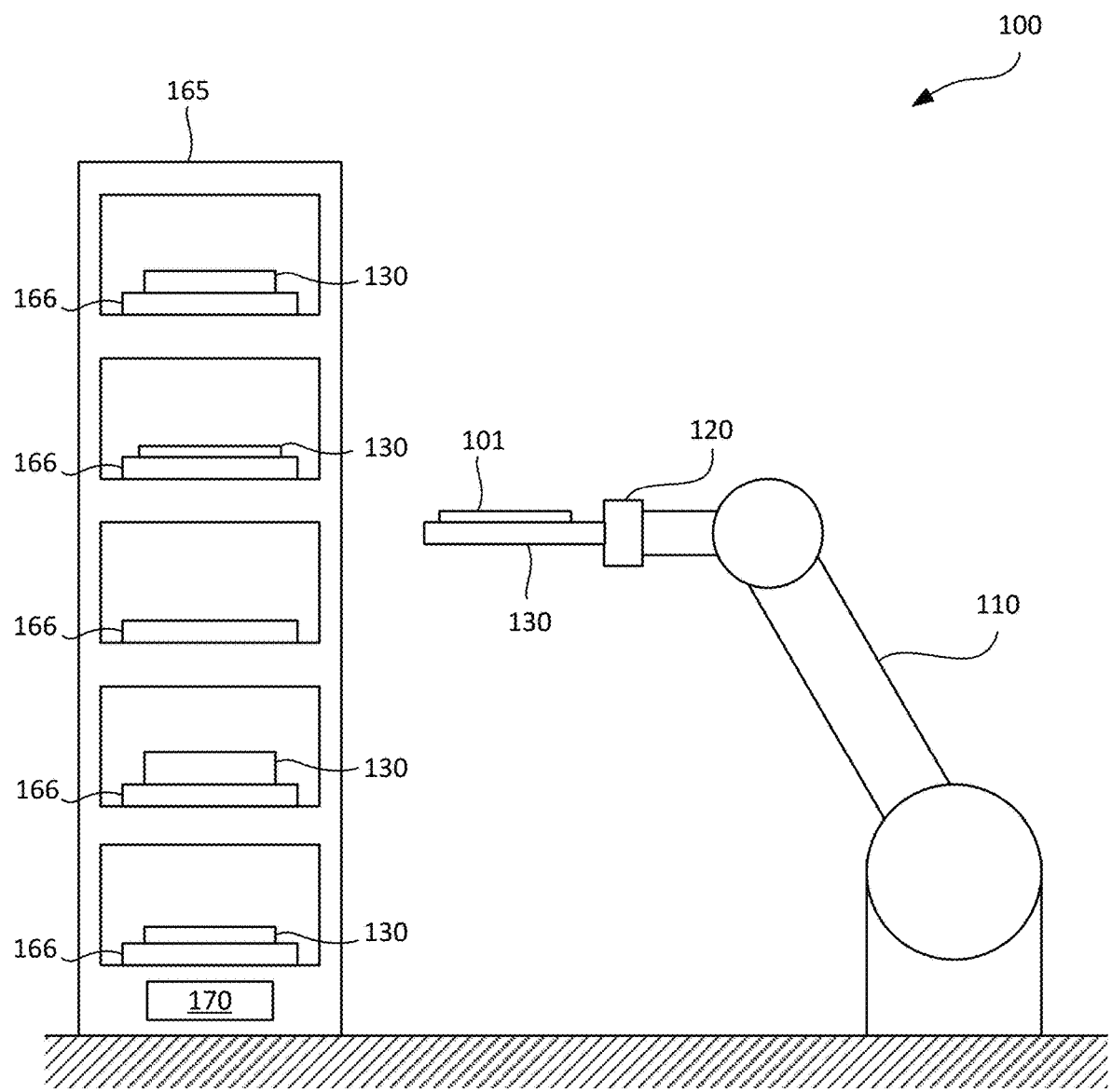
FIG. 1 illustrates a system according to an embodiment of the present disclosure.

The tool exchanger 160 may be disposed in a garage 165. The garage 165 may be configured to store one or more end effectors 130 (as shown in FIG. 1). For example, the garage 165 may include one or more platforms 166, and one end effector 130 may be disposed on each platform 166. Each end effector 130 may be disposed upside down on a platform 166 (i.e., such that the upper jaw 140 is disposed on the platform 166). Alternatively, each end effector 130 may be disposed such that the lower jaw 150 is disposed on the platform 166. The one or more platforms 166 may be arranged vertically within the garage 165. Each platform 166 may be vertically movable within the garage 165. The tool exchanger 160 may be vertically movable within the garage 165. When the end effector 130 is positioned in the garage 165, the pair of grip arms 161 may be configured to separate the upper jaw 140 and the lower jaw 150. For example, the pair of grip arms 161 may be moved vertically within the garage 165 so as to align with the end effector 130. The pair of grip arms 161 may also be moved inwardly/outwardly in order to engage with the upper jaw 140 and the lower jaw 150. It should be understood that a combination of vertical movements and inward/outward movements of the pair of grip arms 161 may be used to avoid contact with the end effector 130 during vertical movement of the tool exchanger 160 and/or to engage with the upper jaw 140 and the lower jaw 150. In some embodiments, the pair of grip arms 161 may only move vertically within the garage 165 to perform tool exchange without any inward/outward movements. The pair of grip arms 161 may be configured to not apply lateral forces on to the end effector 130 during tool exchange, so as not to trip a robot servo open loop of the robot arm 110.

The system 100 may further comprise a processor 170. The processor 170 may include a microprocessor, a microcontroller, or other devices.

The processor 170 may be coupled to the components of the system 100 in any suitable manner (e.g., via one or more transmission media, which may include wired and/or wireless transmission media) such that the processor 170 can receive output. The processor 170 may be configured to perform a number of functions using the output. The wafer inspection tool can receive instructions or other information from the processor 170. The processor 170 optionally may be in electronic communication with another wafer inspection tool, a wafer metrology tool, or a wafer review tool (not illustrated) to receive additional information or send instructions.

The processor 170 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 170 may be disposed in or otherwise part of the system 100 or another device. In an example, the processor 170 and may be part of a standalone control unit or in a centralized quality control unit. Multiple processors 170 may be used, defining multiple subsystems of the system 100.

The processor 170 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 170 to implement various methods and functions may be stored in readable storage media, such as a memory.

If the system 100 includes more than one subsystem, then the different processors 170 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 170 may be configured to perform a number of functions using the output of the system 100 or other output. For instance, the processor 170 may be configured to send the output to an electronic data storage unit or another storage medium. The processor 170 may be further configured as described herein.

The processor 170 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 170 may be configured according to any of the embodiments described herein. The processor 170 also may be configured to perform other functions or additional steps using the output of the system 100 or using images or data from other sources.

The processor 170 may be communicatively coupled to any of the various components or sub-systems of system 100 in any manner known in the art. Moreover, the processor 170 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 170 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 170 (or computer subsystem) or, alternatively, multiple processors 170 (or multiple computer subsystems). Moreover, different sub-systems of the system 100 may include one or more computing or logic systems. Therefore, the above description should not be interpreted as a limitation on the present disclosure but merely an illustration.

The system 100 may further comprise an optical sensor 171. The optical sensor 171 may be in electronic communication with the processor 170. The optical sensor 171 may be disposed in the garage 165, e.g., on the platform 166. The optical sensor 171 may be configured to detect when the end effector 130 is positioned in the garage 165, i.e., on the platform 166. For example, the optical sensor 171 may produce an output signal based on light received from a light source 172. The light source 172 may be disposed in the garage 165 above the platform 166. The output signal may be distinguishable when the end effector 130 is positioned in the garage 165. For example, the optical sensor 171 may receive the light from the light source 172 when the end effector 130 is not positioned in the garage 165, and the end effector 130 may block or interrupt the light received by the optical sensor 171 when the end effector 130 is disposed in the garage 165. In this way, the system 100 may distinguish which platforms 166 have an end effector 130 disposed thereon using the optical sensor 171, and the processor 170 may control the tool exchanger 160 to move to an appropriate platform 166 for coupling/uncoupling the end effector 130 with robot arm 110 via the robot interface 120. The system 100 may comprise other sensors that may be configured to detect when the end effector 130 is positioned in the garage 165, such as a micro switch, magnetic switch (e.g., a Reed switch, Hall effect switch, etc.), or a pneumatic pressure sensor (e.g., orifice/pressure drop sensor).

The system 100 may further comprise a measurement sensor 173. The measurement sensor 173 may be in electronic communication with the processor 170. The measurement sensor 173 may be disposed in the garage above the platform 166. The measurement sensor 173 may be configured to detect a thickness of the end effector 130. For example, the measurement sensor 173 may emit a laser that reflects off a surface of the end effector 130. Based on the amount of time between laser emission and detection by the measurement sensor 173, the thickness of the end effector 130 may be determined. It should be understood that different end effectors 130 may have different thicknesses, and thus the measurement sensor 173 may be used to determine which type of end effector 130 is disposed on the platform 166. Furthermore, the thickness of the end effector 130 may depend on the alignment of the end effector 130 with the robot interface 120 during coupling. For example, the measurement sensor 173 may detect a larger thickness of the end effector 130 when the end effector 130 and robot interface 120 are misaligned compared to when the end effector 130 and robot interface 120 are properly aligned. In this way, the processor 170 may use the measurement sensor 173 to detect whether the end effector 130 is properly coupled to the robot arm 110 via the robot interface 120, and may control the tool exchanger 160 and/or the robot arm 110 to realign the end effector 130 and the robot interface 120 for proper coupling. The system 100 may comprise other sensors configured to detect the thickness of the end effector 130, such as an optical micrometer, which measures how much of a broad beam of light is blocked by the end effector 130, capacitive or inductive proximity sensors, pressure sensors, ultrasonic sensors, or shadow graph camera based sensors.

With the system 100, an end effector and tool exchange system are provided for carrying semiconductor substrates that may provide several advantages compared to the related art. For example, the system 100 may be lightweight, so as not to affect robot speed or system throughput. The system 100 may also be compact, so as not to limit the robot envelope. The system 100 may be robot agnostic, so as to integrate with existing and new robot arms. The system 100 may also be externally actuated, so as not to require integration with the robot arm and to allow safety checks to ensure proper coupling. The system 100 may be cleanroom compatible, by producing low particulates (e.g., less than 45 nm particles) when performing tool exchanging.

Figure 6A:
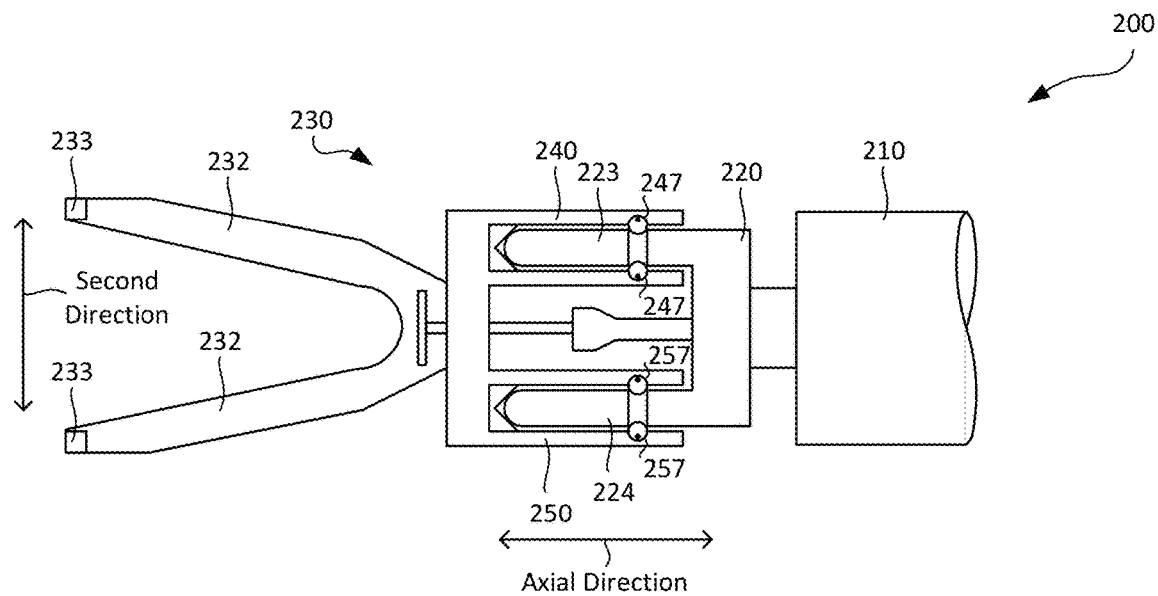
FIG. 6A is a cross-sectional top view of an end effector coupled to a robot interface according to another embodiment of the present disclosure.
Figure 6B:
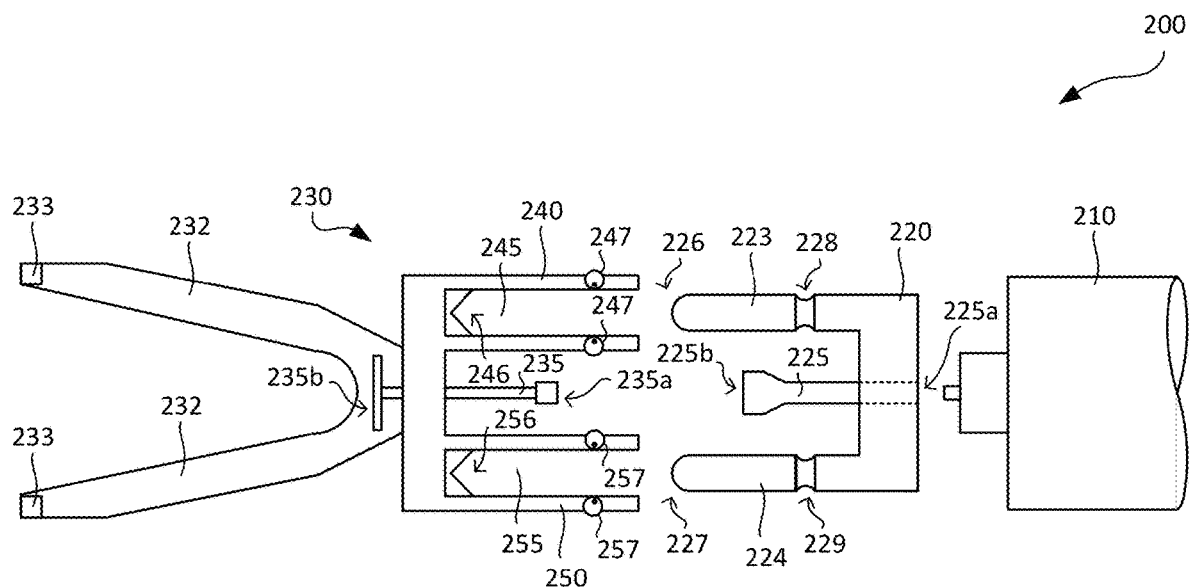
FIG. 6B is a cross-sectional top view of the end effector and robot interface of FIG. 6A uncoupled from each other.

Referring to FIGS. 6A and 6B, another embodiment of the present disclosure provides a system 200. The system 200 differs from the system 100 in the structure of the robot interface 220 and the end effector 230. Except as otherwise described herein, the components of the system 100 may also be applied to the system 200.

The end effector 230 may comprise a first sleeve 240 and a second sleeve 250. The first sleeve 240 and the second sleeve 250 may extend in the axial direction toward the robot interface 220. The first sleeve 240 and the second sleeve 250 may be spaced apart in the second direction. The first sleeve 240 may have a first interior space 245, and the second sleeve 250 may have a second interior space 255. The first interior space 245 and the second interior space 255 may have a cylindrical or rectangular shape. A distal end 246 of the first interior space 245 and a distal end 256 of the second interior space 255 may be comprised of a tetrahedral groove, a cone-shaped groove, a v-shaped groove, or a flat groove.

The end effector 230 may further comprise a pair of arms 232. The pair of arms 232 may be configured to carry a substrate (not shown). The pair of arms 232 may be spaced apart in the second direction. The pair of arms 232 may include one or more protrusions 233 configured to contact the substrate. The one or more protrusions 233 may be comprised of an elastomeric material and may provide grip when contacting the substrate.

The robot interface 220 may comprise a first insertion member 223 and a second insertion member 224. The first insertion member 223 and the second insertion member 224 may extend in the axial direction toward the end effector 230. The first insertion member 223 and the second insertion member 224 may be spaced apart in the second direction. The first insertion member 223 and the second insertion member 224 may have a cylindrical or rectangular shape. A distal end 226 of the first insertion member 223 and a distal end 227 of the second insertion member 224 may have a hemispherical shape. When the end effector 230 is coupled to the robot arm 210, the first insertion member 223 and the second insertion member 224 of the robot interface 220 may be received in the first sleeve 240 and the second sleeve 250. For example, the distal end 226 of the first insertion member 223 may contact the distal end 246 of the first interior space 245, and the distal end 227 of the second insertion member 224 may contact the distal end 256 of the second interior space 255.

The end effector 230 may further comprise a first pair of cam locks 247 and a second pair of cam locks 257. The first pair of cam locks 247 and the second pair of cam locks 257 may be disposed in the first interior space 245 and the second interior space 255, respectively. The first pair of cam locks 247 and the second pair of cam locks 257 may be rotatable between an unlocked position (where the cam locks do not extend into the interior space of the respective sleeve) and a locked position (where the cam locks extend into the interior space of the respective sleeve). The first pair of cam locks 247 and the second pair of cam locks 257 may be rotatable externally by a tool exchanger (not shown) to change between the unlocked position and the locked position.

The robot interface 220 may further comprise a first circumferential groove 228 on the first insertion member 223 and a second circumferential groove 229 on the second insertion member 224. When the first insertion member 223 and the second insertion member 224 are received in the first sleeve 240 and the second sleeve 250, respectively, the first circumferential groove 228 may align with the first pair of cam locks 247, and the second circumferential groove 229 may align with the second pair of cam locks 257. Accordingly, when the first pair of cam locks 247 and the second pair of cam locks 257 are rotated to the locked position, the first pair of cam locks 247 may be received in the first circumferential groove 228, and the second pair of cam locks 257 may be received in the second circumferential groove 229. In this way, the robot interface 220 may be constrained within the first sleeve 240 and the second sleeve 250, such that the end effector 230 is selectively coupled to the robot arm 210 via the robot interface 220.

The end effector 230 may further comprise a plunger 235. The plunger 235 may be centrally disposed in the end effector 230 in the second direction. The plunger 235 may have a first end 235a and a second end 235b. The robot interface 220 may further comprise a plunger socket 225. The plunger socket 225 may have a first end 225a and a second end 225b. When the end effector 230 is coupled to the robot arm 210 via the robot interface 220, the plunger 235 may be coupled to the plunger socket 225. For example, the first end 235a of the plunger 235 may be coupled to the second end 225b of the plunger socket 225. The robot arm 210 may be configured to move the coupled plunger 235 and plunger socket 225 in an axial direction. For example, the robot arm 210 may interact with the first end 225a of the plunger socket 225 to move the coupled plunger 235 and plunger socket 225 in the axial direction. The second end 235b of the plunger 235 may be configured to contact the substrate disposed on the end effector 230. Thus, by moving the coupled plunger 235 and plunger socket 225 in the axial direction, the second end 235b of the plunger 235 may press against the substrate and hold the substrate on the end effector 230. The second end 235b of the plunger 235 may be comprised of an elastomeric material and may provide grip when contacting the substrate. The robot arm 210 may also be configured to retract the coupled plunger 235 and plunger socket 225 in order to release the grip on the substrate. The end effector 230 may comprise a preload spring (not shown) configured to bias the plunger 235 toward a retracted position to assist retraction of the coupled plunger 235 and plunger socket 225 by the robot arm 210. Alternatively, the robot arm 210 may be configured to retract the coupled plunger 235 and plunger socket 225 unassisted.

With the system 200, an end effector and tool exchange system are provided for carrying semiconductor substrates that may provide several advantages compared to the related art. For example, the system 200 may be lightweight, so as not to affect robot speed or system throughput. The system 200 may also be compact, so as not to limit the robot envelope. The system 200 may be robot agnostic, so as to integrate with existing and new robot arms. The system 200 may also be externally actuated, so as not to require integration with the robot arm and to allow safety checks to ensure proper coupling. The system 200 may be cleanroom compatible, by producing low particulates (e.g., less than 45 nm particles) when performing tool exchanging.

Referring to FIGS. 7-10, another embodiment of the present disclosure provides a system 300. The system 300 differs from the system 100 in the structure of the robot interface 320 and the end effector 330. Except as otherwise described herein, the components of the system 100 may also be applied to the system 300.

The robot interface 320 may comprise one or more hemispherical structures 323 disposed on a lower surface 322 of the robot interface 320. The one or more hemispherical structures 323 may be at different elevations in the first direction. For example, one of the hemispherical structures 323 may be higher than another hemispherical structure 323 in the first direction. In an embodiment, the robot interface 320 may comprise three hemispherical structures 323. The three hemispherical structures 323 may be arranged in a triangle. For example, two of the hemispherical structures 323 may be disposed at the lower elevation of the lower surface 322 of the robot interface 320, and the third hemispherical structure 323 may be disposed at the higher elevation of the lower surface 322 of the robot interface 320.

The end effector 330 may comprise one or more grooves 346 disposed on an upper surface 331 of the end effector 330. The one or more grooves 346 may comprise one or more of a tetrahedral groove, a cone-shaped groove, a v-shaped groove, or a flat groove. The one or more grooves 346 may be at different elevations in the first direction. For example, one of the grooves 346 may be higher than another groove 346 in the first direction. In an embodiment, the end effector 330 may comprise three v-shaped grooves 346. The three grooves 346 may be arranged in a triangle. For example, two of the v-shaped grooves 346 may be disposed at the lower elevation of the upper surface 331 of the end effector 330, and the third v-shaped groove 346 may be disposed at the higher elevation of the upper surface 331 of the end effector 330. The three v-shaped grooves 346 may be angled relative to one another. For example, the three v-shaped grooves 346 may be angled about 120° relative to one another. When the robot interface 320 is disposed on the end effector 330, the one or more hemispherical structures 323 may align with and contact the one or more grooves 346.

Figure 7A:
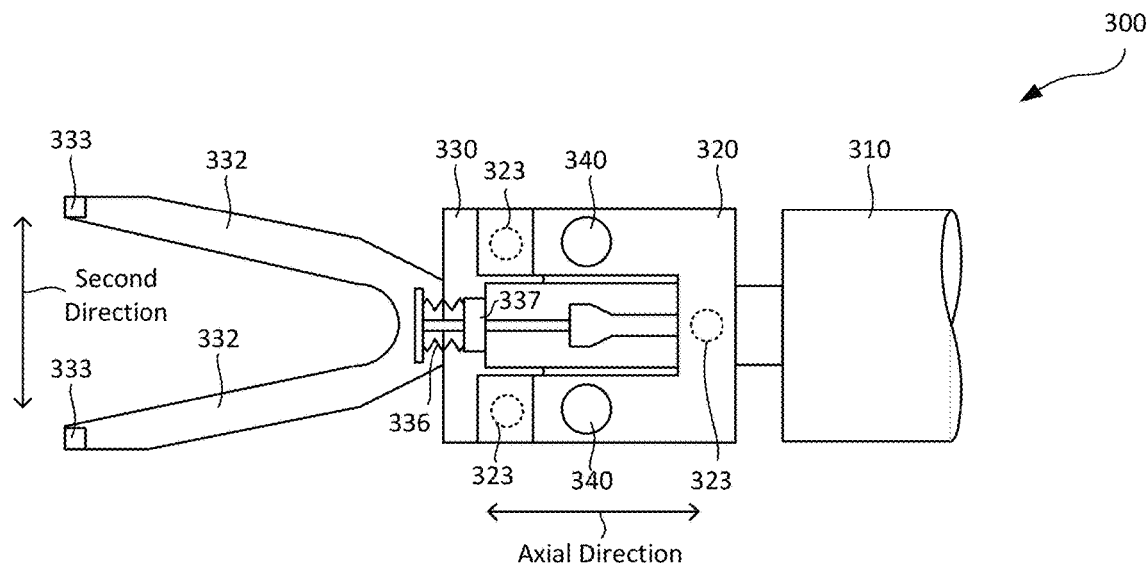
FIG. 7A is a top view of an end effector coupled to a robot interface according to another embodiment of the present disclosure.
Figure 7B:
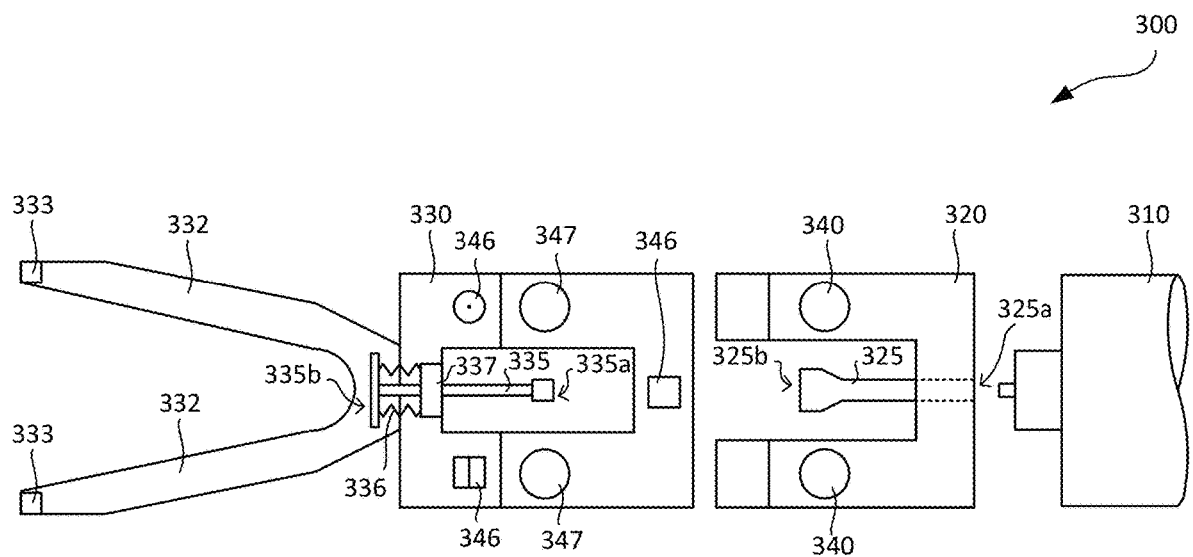
FIG. 7B is a top view of the end effector an robot interface of FIG. 7A uncoupled from each other.

The end effector 330 may further comprise a pair of arms 332, as shown in FIGS. 7A and 7B. The pair of arms 332 may be configured to carry a substrate (not shown). The pair of arms 332 may be spaced apart in the second direction. The pair of arms 332 may include one or more protrusions 333 configured to contact the substrate. The one or more protrusions 333 may be comprised of an elastomeric material and may provide grip when contacting the substrate.

The robot interface 320 may comprise a locking mechanism 340. The locking mechanism may be configured to selectively couple the end effector 330 to the robot arm 310 via the robot interface 320. The locking mechanism may be engaged to lock and/or unlock using a tool exchanger (not shown), operable from an upper surface 321 of the robot interface 320.

Figure 8A:
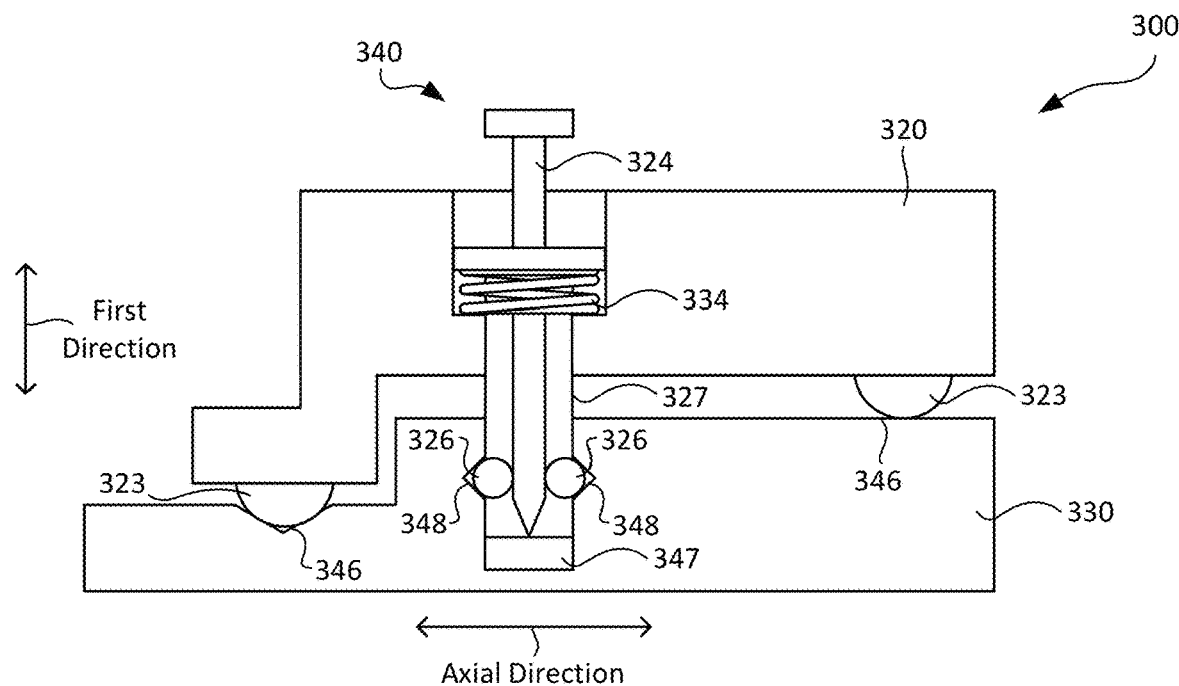
FIG. 8A is a side view of the end effector and robot interface of FIG. 7A coupled to each other by a pinball lock mechanism.
Figure 8B:
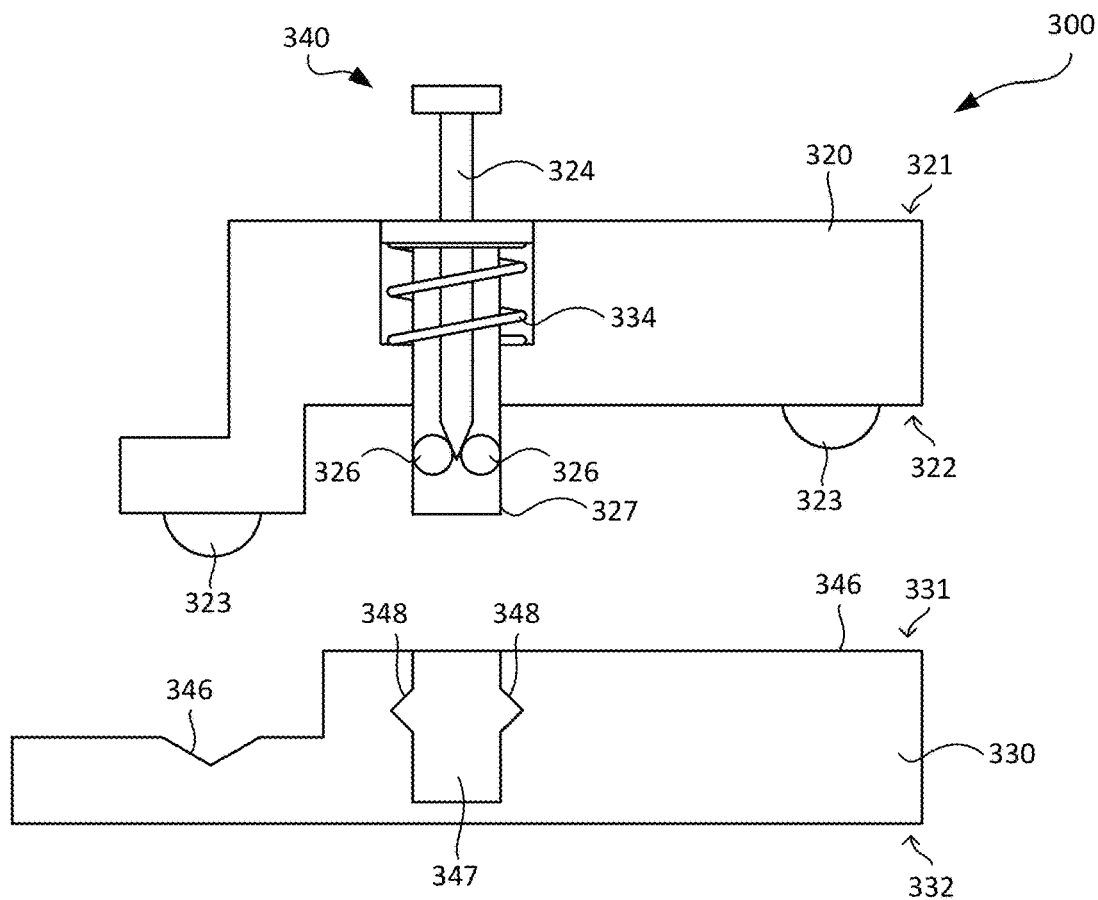
FIG. 8B is a side view of the end effector and robot interface of FIG. 8A uncoupled from each other.

The locking mechanism 340 may comprise a pinball lock mechanism. As shown in FIGS. 8A and 8B, the pinball lock mechanism may comprise a locking pin 324 and one or more ball locks 326 disposed in a shaft 327. The shaft 327 may be biased by a preload spring 334 in the first direction. The shaft 327 may be received in a corresponding bore 347 of the end effector 330 when the end effector 330 is coupled to the robot arm 310 via the robot interface 320. The locking pin 324 may be movable in the first direction inside the shaft 327, for example, by the tool exchanger. When the locking pin 324 is moved downward into the shaft 327, the ball locks 326 may be moved radially outward such that they engage with a circumferential groove 348 of the bore 347. Accordingly, the robot interface 320 and the end effector 330 may be locked together by the pinball lock mechanism. The locking pin 324 can be moved in the opposite direction to move the ball locks 326 back radially inward, such that the shaft 327 can be withdrawn from the bore 347.

Figure 9A:
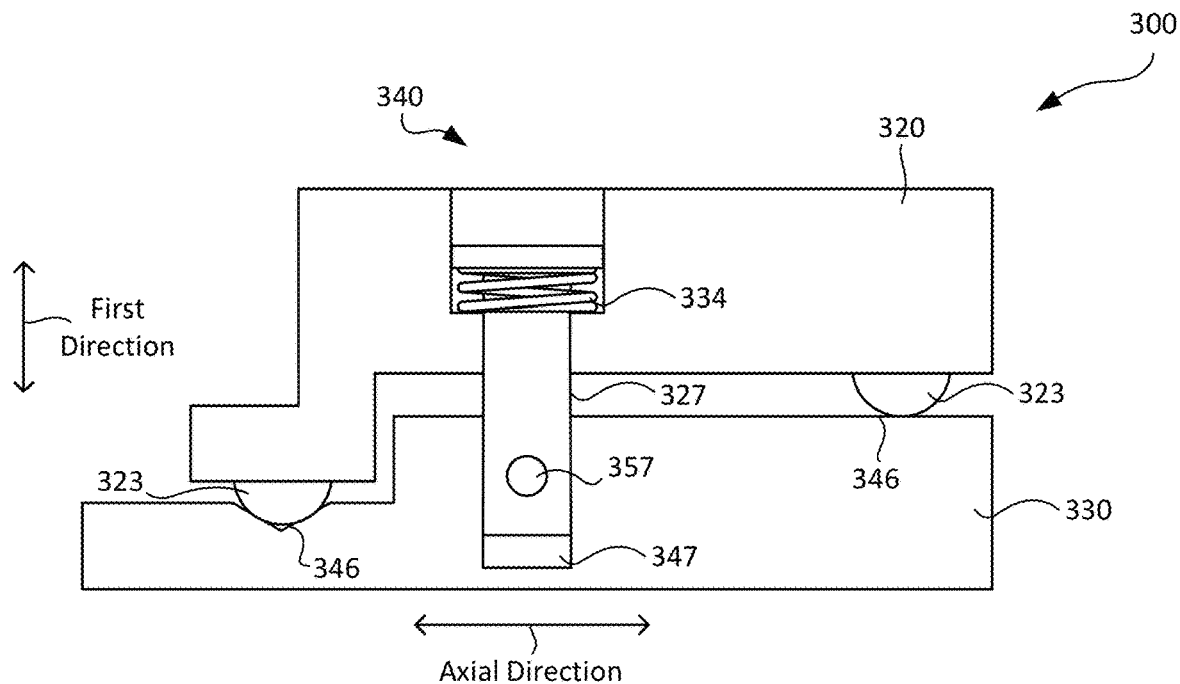
FIG. 9A is a side view of the end effector and robot interface of FIG. 7A coupled to each other by a pin lock mechanism.
Figure 9B:
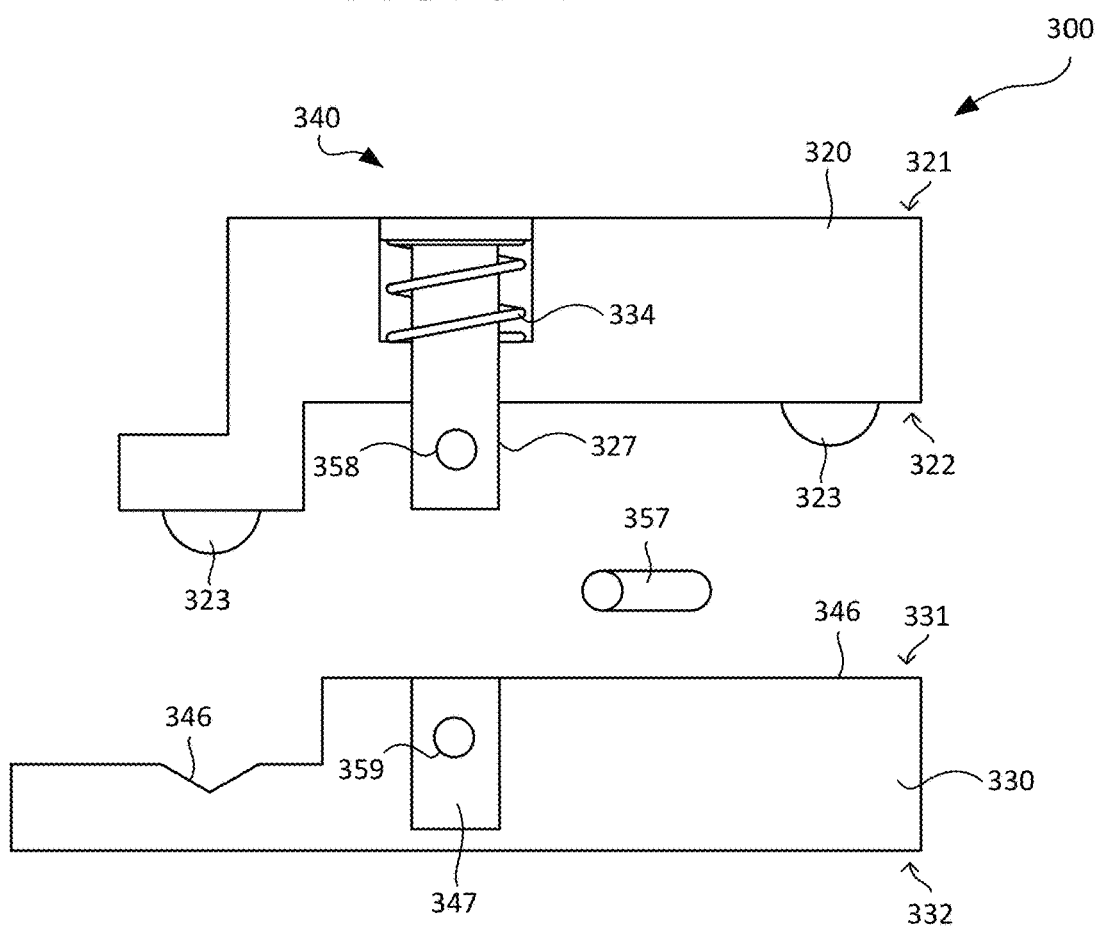
FIG. 9B is a side view of the end effector and robot interface of FIG. 9A uncoupled from each other.

Alternatively, the locking mechanism 340 may comprise a pin lock mechanism. As shown in FIGS. 9A and 9B, the pin lock mechanism may comprise a removable pin 357. The removable pin 357 may be inserted into a first aperture 358 in the shaft 327 and into a second aperture 359 in the bore 347. The first aperture 358 and the second aperture 359 may align in the first direction when the shaft 327 is received in the bore 347, such that the removable pin 357 can be inserted into the first aperture 358 and the second aperture 359. The removable pin 357 may be inserted in the second direction, for example, by the tool exchanger.

Figure 10A:
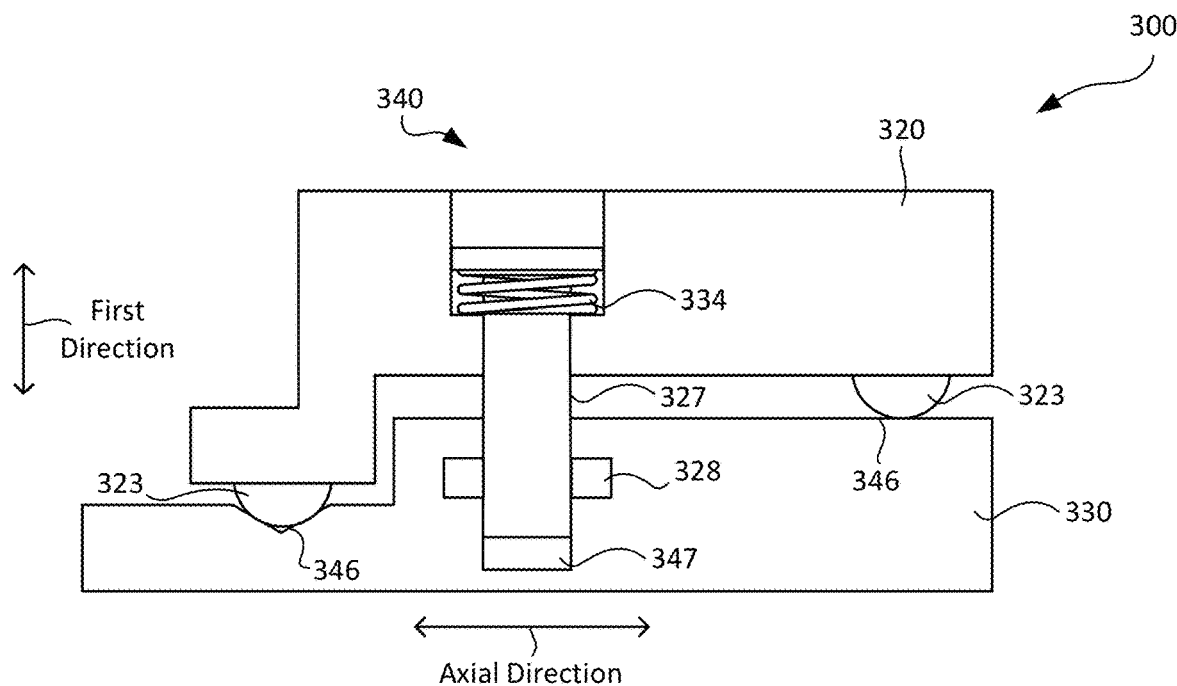
FIG. 10A is a side view of the end effector and robot interface of FIG. 7A coupled to each other by a cam lock mechanism.
Figure 10B:
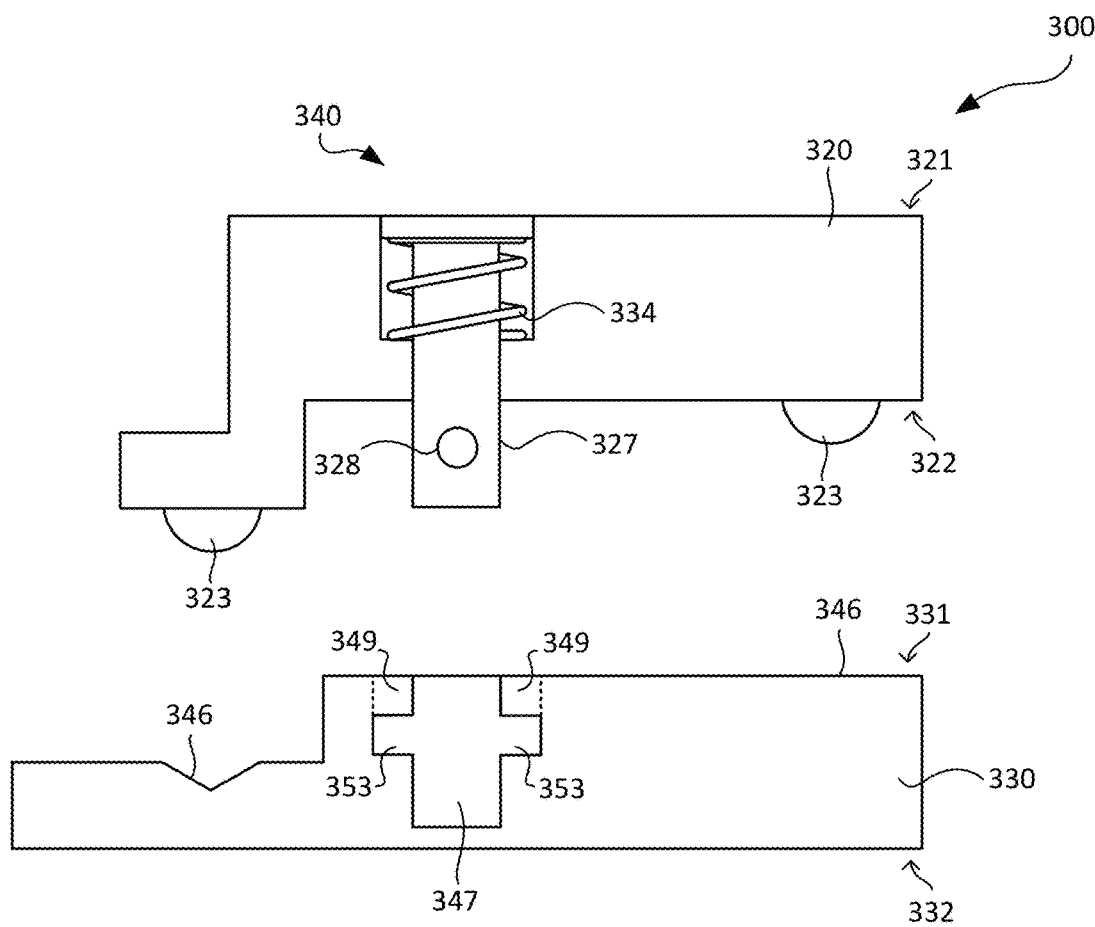
FIG. 10B is a side view of the end effector and robot interface of FIG. 10A uncoupled from each other.

Alternatively, the locking mechanism 340 may comprise a cam lock mechanism. As shown in FIGS. 10A and 10B, the cam lock mechanism may comprise a one or more radial protrusions 328 extending from the shaft 327. The shaft 327 may be rotatable, for example, by the tool exchanger. When the shaft 327 is received in the bore 347, the radial protrusions 328 may be received in a keyway 349 of the bore 347. The keyway 349 may be open to the upper surface 331 of the end effector 330, and may extend downward and circumferentially around the bore 347. By rotating the shaft 327, the radial protrusions 328 may be received in a locking portion 353 of the keyway 349, which may prevent the shaft 327 from being withdrawn from the bore 347. Accordingly, the robot interface 320 and the end effector 330 may be locked together by the cam lock mechanism. The shaft 327 can be rotated in the opposite direction to move the radial protrusions 328 out of the locking portion 353 of the keyway 349, such that the shaft 327 can be withdrawn from the bore 347.

Referring to FIGS. 7A and 7B, the end effector 330 may further comprise a plunger 335. The plunger 335 may be centrally disposed in the end effector 330 in the second direction. The plunger 335 may have a first end 335a and a second end 335b. The robot interface 320 may further comprise a plunger socket 325. The plunger socket 325 may have a first end 325a and a second end 325b. When the end effector 330 is coupled to the robot arm 310 via the robot interface 320, the plunger 335 may be coupled to the plunger socket 325. For example, the first end 335a of the plunger 335 may be coupled to the second end 325b of the plunger socket 325. The robot arm 310 may be configured to move the coupled plunger 335 and plunger socket 325 in an axial direction. For example, the robot arm 310 may interact with the first end 325a of the plunger socket 325 to move the coupled plunger 335 and plunger socket 325 in the axial direction. The second end 335b of the plunger 335 may be configured to contact the substrate disposed on the end effector 330. Thus, by moving the coupled plunger 335 and plunger socket 325 in the axial direction, the second end 335b of the plunger 335 may press against the substrate and hold the substrate on the end effector 330. The second end 335b of the plunger 335 may be comprised of an elastomeric material and may provide grip when contacting the substrate. The robot arm 310 may also be configured to retract the coupled plunger 335 and plunger socket 325 in order to release the grip on the substrate. The end effector 330 may comprise a preload spring 336 configured to bias the plunger 335 toward a retracted position to assist retraction of the coupled plunger 335 and plunger socket 325 by the robot arm 310. Alternatively, the robot arm 310 may be configured to retract the coupled plunger 335 and plunger socket 325 unassisted. The plunger 335 may be disposed in a bushing 337 arranged on the upper surface 331 of the end effector 330.

With the system 300, an end effector and tool exchange system are provided for carrying semiconductor substrates that may provide several advantages compared to the related art. For example, the system 300 may be lightweight, so as not to affect robot speed or system throughput. The system 300 may also be compact, so as not to limit the robot envelope. The system 300 may be robot agnostic, so as to integrate with existing and new robot arms. The system 300 may also be externally actuated, so as not to require integration with the robot arm and to allow safety checks to ensure proper coupling. The system 300 may be cleanroom compatible, by producing low particulates (e.g., less than 45 nm particles) when performing tool exchanging.

Figure 11A:
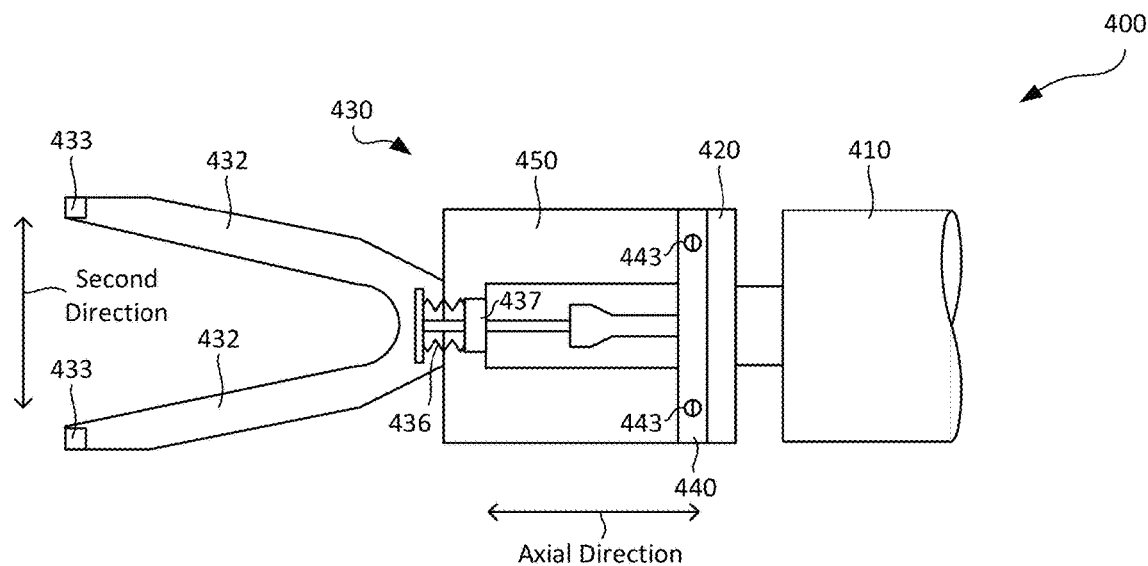
FIG. 11A is a top view of an end effector coupled to a robot interface according to another embodiment of the present disclosure.
Figure 11B:
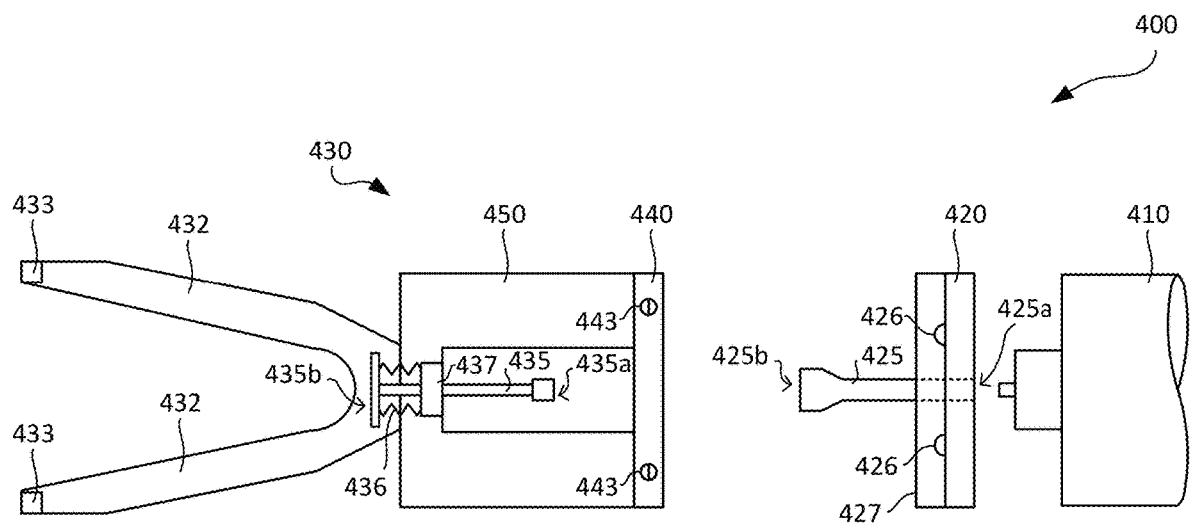
FIG. 11B is a top view of the end effector and robot interface of FIG. 11A uncoupled from each other.

Referring to FIGS. 11-13, another embodiment of the present disclosure provides a system 400. The system 400 differs from the system 100 in the structure of the robot interface 420 and the end effector 430. Except as otherwise described herein, the components of the system 100 may also be applied to the system 400.

Figure 12A:
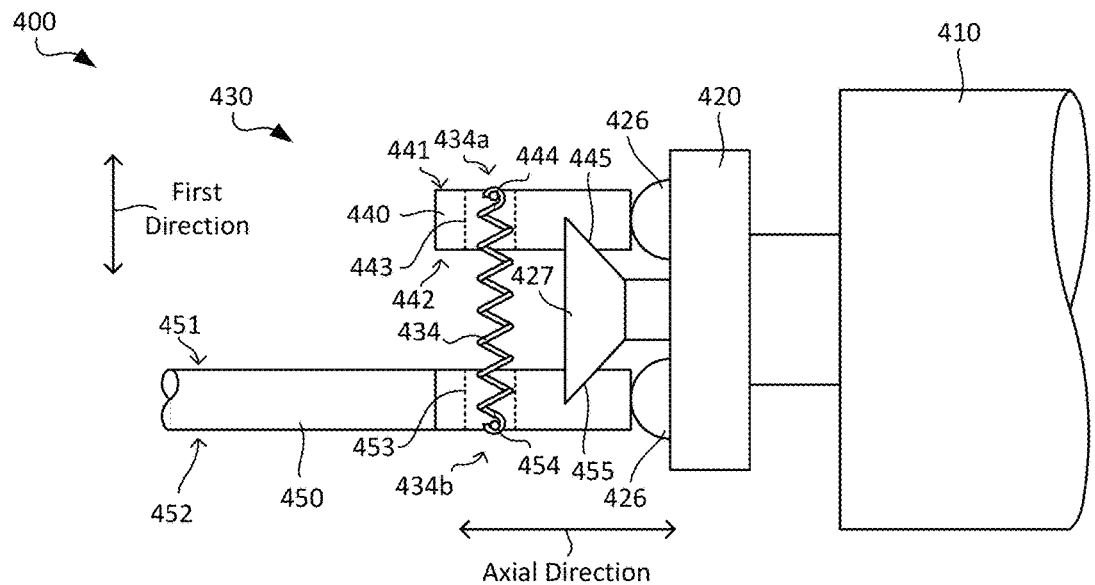
FIG. 12A is a side view of the end effector and robot interface of FIG. 11A coupled to each other by a dovetail lock mechanism.
Figure 12B:
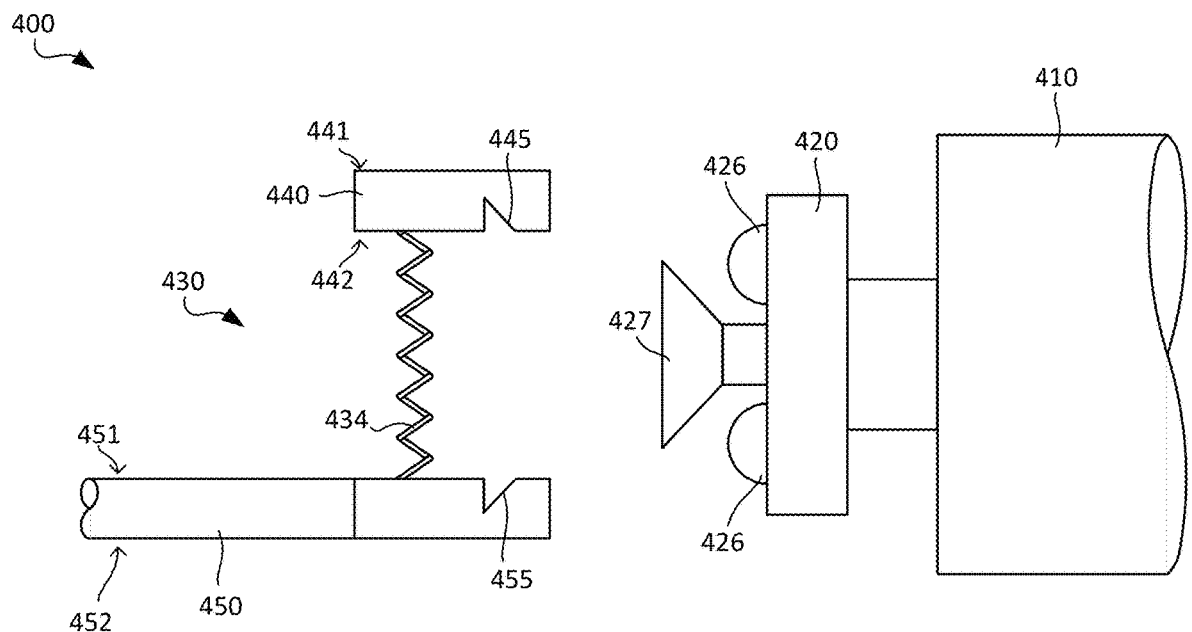
FIG. 12B is a side view of the end effector and robot interface of FIG. 12A uncoupled from each other.

The end effector 430 may comprise an upper jaw 440 and a lower jaw 450, as shown in FIGS. 12A and 12B. The upper jaw 440 and the lower jaw 450 may be spaced apart in the first direction. The upper jaw 440 and the lower jaw 450 may be biased together. When the end effector 430 is coupled to the robot arm 410, the robot interface 420 may be disposed between the upper jaw 440 and the lower jaw 450. The upper jaw 440 and the lower jaw 450 may be separated by a tool exchanger (not shown) in order to allow the robot interface 420 to be received in and/or withdrawn from between the upper jaw 440 and the lower jaw 450.

The end effector 430 may further comprise a pair of arms 432, as shown in FIGS. 11A and 111B. The pair of arms may be integrally formed with the upper jaw 440 and/or the lower jaw 450. The pair of arms 432 may be configured to carry a substrate (not shown). The pair of arms 432 may be spaced apart in the second direction. The pair of arms 432 may include one or more protrusions 433 configured to contact the substrate. The one or more protrusions 433 may be comprised of an elastomeric material and may provide grip when contacting the substrate.

The robot interface 420 may comprise a dovetail lock mechanism. As shown in FIGS. 12A and 12B, the dovetail lock mechanism may comprise a dovetail-shaped protrusion 427 extending from the robot interface 420 toward the end effector 430. The upper jaw 440 may comprise a first dovetail surface 445 on its lower surface 442, and the lower jaw 450 may comprise a second dovetail surface 455 on its upper surface 451. The first dovetail surface 445 and the second dovetail surface 455 may be configured to engage with the dovetail-shaped protrusion 427 of the robot interface 420 when the robot interface 420 is coupled to the end effector 430. The robot interface 420 may further comprise a pair of hemispherical structures 426 adjacent to the dovetail-shaped protrusion 427, which engage flat end surfaces of the upper jaw 440 and the lower jaw 450 when the robot interface 420 is coupled to the end effector 430.

Figure 13A:
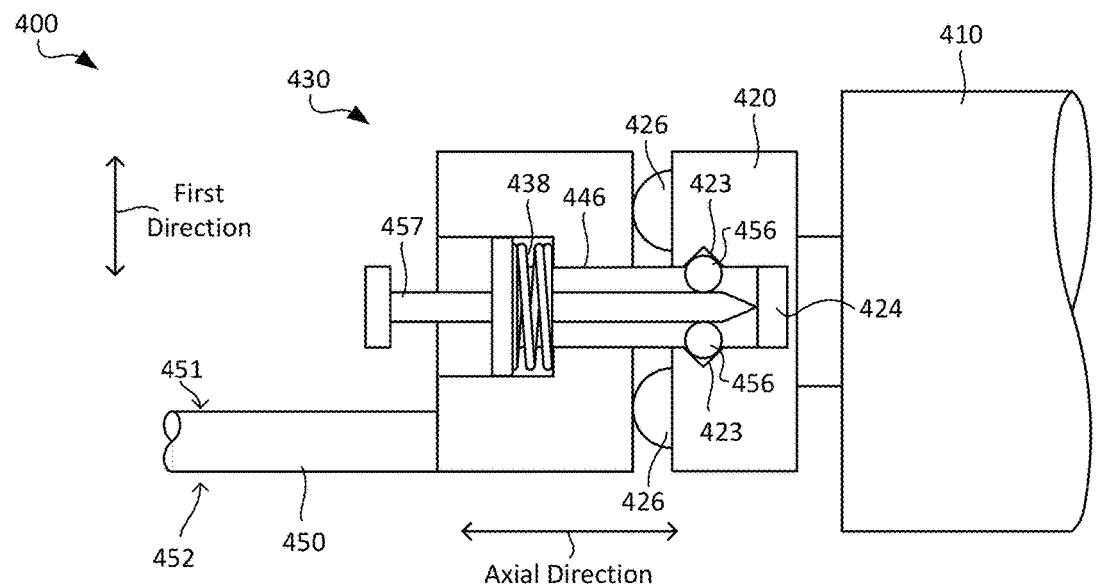
FIG. 13A is a side view of the end effector and robot interface of FIG. 11A coupled to each other by a pinball lock mechanism.
Figure 13B:
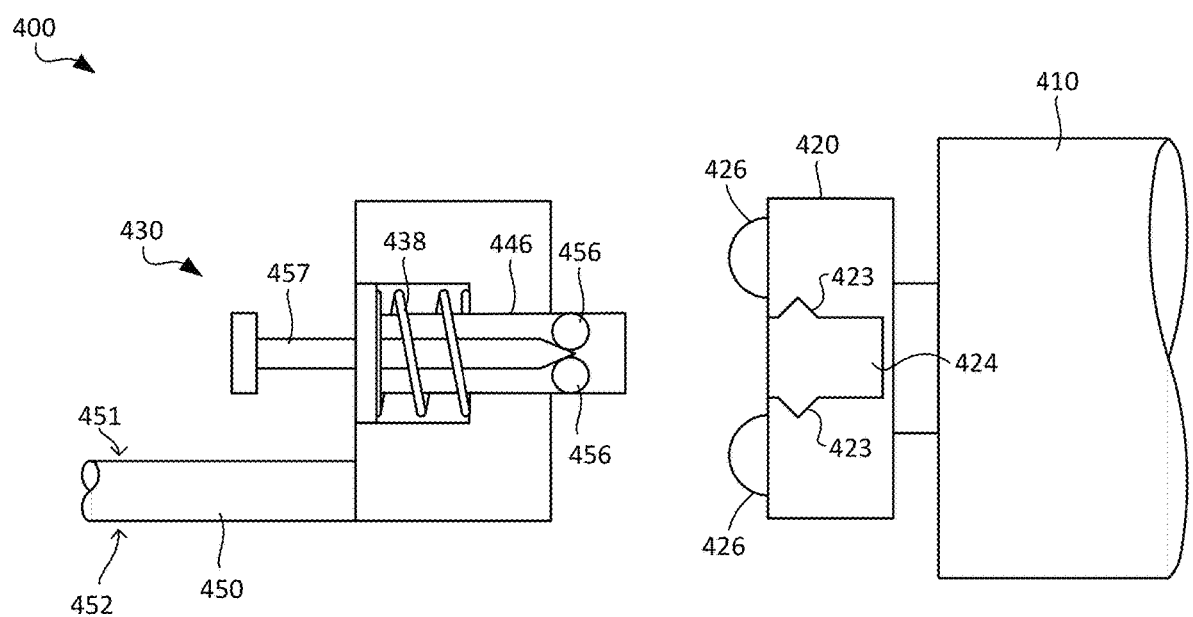
FIG. 13B is a side view of the end effector and robot interface of FIG. 13A uncoupled from each other.

Alternatively, the end effector 430 may comprise a pinball lock mechanism. As shown in FIGS. 13A and 13B, the pinball lock mechanism may comprise a locking pin 457 and one or more ball locks 456 disposed in a shaft 446. The shaft 446 may be biased by a preload spring 438 in the axial direction. The shaft 446 may be received in a corresponding bore 424 of the robot interface 420 when the end effector 430 is coupled to the robot arm 410 via the robot interface 420. The locking pin 457 may be movable in the axial direction inside the shaft 446, for example, by a tool exchanger (not shown), operable externally from the end effector 430. When the locking pin 457 is moved into the shaft 446, the ball locks 456 may be moved radially outward such that they engage with a circumferential groove 423 of the bore 424. Accordingly, the robot interface 420 and the end effector 430 may be locked together by the pinball lock mechanism. The locking pin 457 can be moved in the opposite direction to move the ball locks 456 back radially inward, such that the shaft 446 can be withdrawn from the bore 424. The robot interface 420 may further comprise a pair of hemispherical structures 426 adjacent to the bore 424, which engage flat end surfaces of the end effector 430 when the robot interface 420 is coupled to the end effector 430.

Referring to FIGS. 12A and 12B, the end effector 430 may further comprise a plunger 435. The plunger 435 may be centrally disposed in the end effector 430 in the second direction. The plunger 435 may have a first end 435a and a second end 435b. The robot interface 420 may further comprise a plunger socket 425. The plunger socket 425 may have a first end 425a and a second end 425b. When the end effector 430 is coupled to the robot arm 410 via the robot interface 420, the plunger 435 may be coupled to the plunger socket 425. For example, the first end 435a of the plunger 435 may be coupled to the second end 425b of the plunger socket 425. The robot arm 410 may be configured to move the coupled plunger 435 and plunger socket 425 in an axial direction. For example, the robot arm 410 may interact with the first end 425a of the plunger socket 425 to move the coupled plunger 435 and plunger socket 425 in the axial direction. The second end 435b of the plunger 435 may be configured to contact the substrate disposed on the end effector 430. Thus, by moving the coupled plunger 435 and plunger socket 425 in the axial direction, the second end 435b of the plunger 435 may press against the substrate and hold the substrate on the end effector 430. The second end 435b of the plunger 435 may be comprised of an elastomeric material and may provide grip when contacting the substrate. The robot arm 410 may also be configured to retract the coupled plunger 435 and plunger socket 425 in order to release the grip on the substrate. The end effector 430 may comprise a preload spring 436 configured to bias the plunger 435 toward a retracted position to assist retraction of the coupled plunger 435 and plunger socket 425 by the robot arm 410. Alternatively, the robot arm 410 may be configured to retract the coupled plunger 435 and plunger socket 425 unassisted. The plunger 435 may be disposed in a bushing 437 arranged on the upper surface 451 of the lower jaw 450.

The end effector 330 may further comprise a spring 434 connected to the upper jaw 440 and the lower jaw 450. For example, a first end 434a of the spring 434 may be connected to the upper jaw 440, and a second end 434b of the spring 434 may be connected to the lower jaw 450. The spring 434 may be disposed in an upper guide 443 of the upper jaw 440 and a lower guide 453 of the lower jaw 450. The upper guide 443 and the lower guide 453 may be cylindrical channels extending through the upper jaw 440 and the lower jaw 450, respectively. The upper guide 443 may include an upper transverse rod 444 across the upper guide 443 on the upper surface 441 of the upper jaw 440, and the lower guide 453 may include a lower transverse rod 454 across the lower guide 453 on the lower surface 452 of the lower jaw 450. The first end 434a of the spring 434 may be connected to the upper transverse rod 444 and the second end 434b of the spring may be connected to the lower transverse rod 454. For example, the first end 434a and the second end 434b of the spring may have a hook or ring shape that may loop around the upper transverse rod 444 and the lower transverse rod 454, respectively. The spring 434 may be pre-loaded to urge the upper jaw 440 and the lower jaw together 450. In other words, a distance between the lower surface 442 of the upper jaw 440 and the upper surface 451 of the lower jaw 450 may be less than a free length of the spring 434. In this way, the spring 434 may urge the upper jaw 440 and the lower jaw 450 together.

With the system 400, an end effector and tool exchange system are provided for carrying semiconductor substrates that may provide several advantages compared to the related art. For example, the system 400 may be lightweight, so as not to affect robot speed or system throughput. The system 400 may also be compact, so as not to limit the robot envelope. The system 400 may be robot agnostic, so as to integrate with existing and new robot arms. The system 400 may also be externally actuated, so as not to require integration with the robot arm and to allow safety checks to ensure proper coupling. The system 400 may be cleanroom compatible, by producing low particulates (e.g., less than 45 nm particles) when performing tool exchanging.

Figure 14:
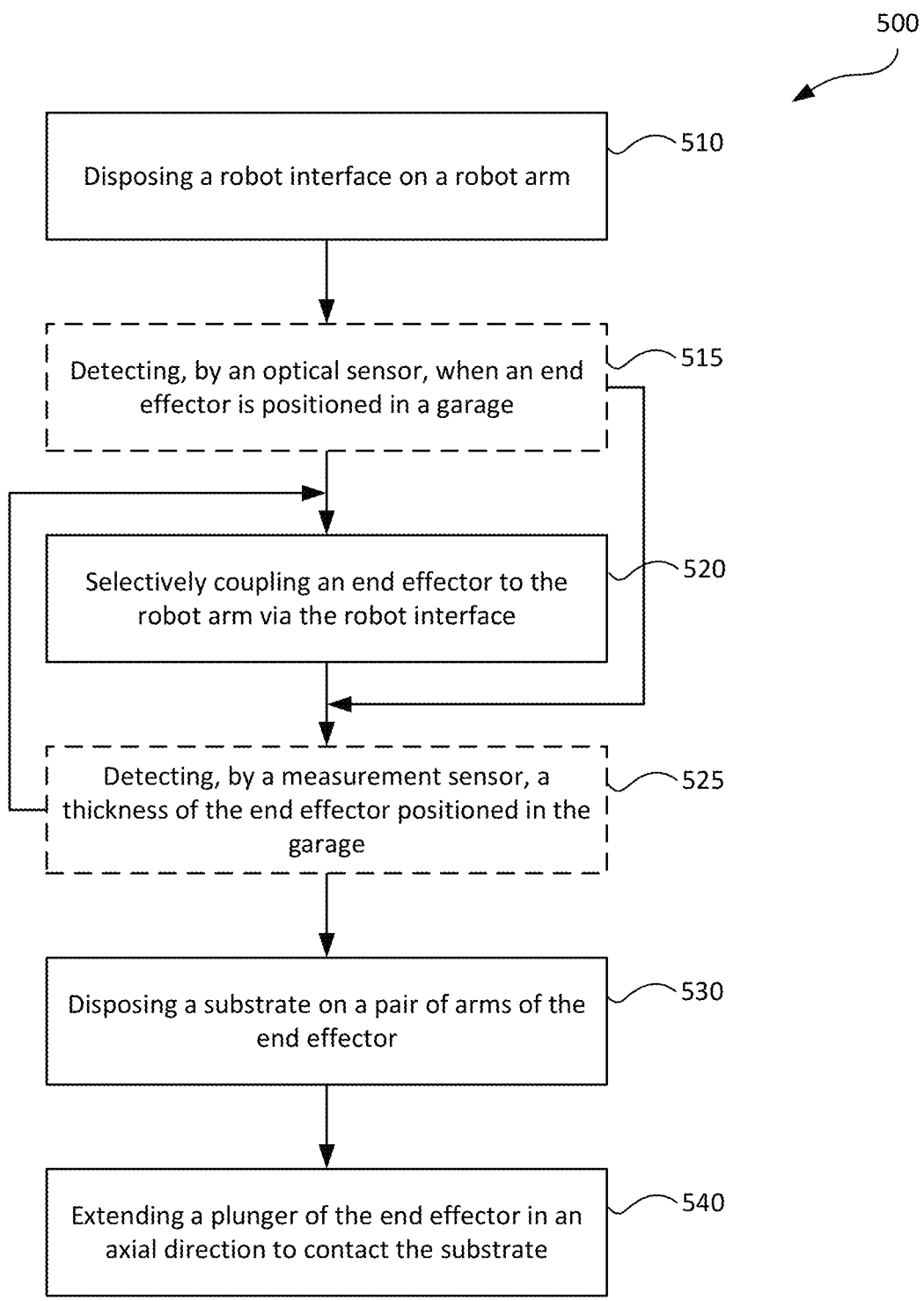
FIG. 14 is a flowchart of a method according to an embodiment of the present disclosure.

Another embodiment of the present disclosure provides a method 500. As shown in FIG. 14, the method 500 may comprise the following steps.

At step 510, a robot interface is disposed on a robot arm. For example, the robot interface may be disposed on a distal end of the robot arm. It should be understood that the manner in which the robot interface is disposed on and/or secured to the robot arm may depend on the particular structure of the robot arm, and is not limited herein. The robot arm may be movable in six degrees of freedom within a robot envelope. The size and shape of the robot envelope may depend on the particular structure of the robot arm (e.g., the lengths of the arms, number of joints, etc.), and is not limited herein.

At step 520, an end effector is selectively coupled to the robot arm via the robot interface. The end effector may comprise an upper jaw and a lower jaw. The upper jaw and the lower jaw being spaced apart in a first direction and biased together. When the end effector is coupled to the robot arm, the robot interface may be disposed between the upper jaw and the lower jaw.

At step 530, a substrate is disposed on a pair of arms of the end effector. The pair of arms may be integrally formed with the upper jaw or the lower jaw. The pair of arms being spaced apart in a second direction orthogonal to the first direction. The pair of arms may include one or more protrusions configured to contact the substrate. The one or more protrusions may be comprised of an elastomeric material and may provide grip when contacting the substrate.

At step 540, a plunger of the end effector is extended in an axial direction to contact the substrate. The robot arm may be configured to extend the plunger in the axial direction. The plunger may be centrally disposed in the end effector in the second direction. The plunger may have a first end and a second end. The robot interface may further comprise a plunger socket. The plunger socket may have a first end and a second end. When the end effector is coupled to the robot arm via the robot interface, the plunger may be coupled to the plunger socket. For example, the first end of the plunger may be coupled to the second end of the plunger socket. The robot arm may be configured to move the coupled plunger and plunger socket in an axial direction. For example, the robot arm may interact with the first end of the plunger socket to move the coupled plunger and plunger socket in the axial direction. The second end of the plunger may be configured to contact the substrate disposed on the end effector. Thus, by moving the coupled plunger and plunger socket in the axial direction, the second end of the plunger may contact and press against the substrate and hold the substrate on the end effector. The second end of the plunger may be comprised of an elastomeric material and may provide grip when contacting the substrate. The robot arm may also be configured to retract the coupled plunger and plunger socket in order to release the grip on the substrate. The end effector may comprise a preload spring configured to bias the plunger toward a retracted position to assist retraction of the coupled plunger and plunger socket by the robot arm. Alternatively, the robot arm may be configured to retract the coupled plunger and plunger socket unassisted.

Figure 15:
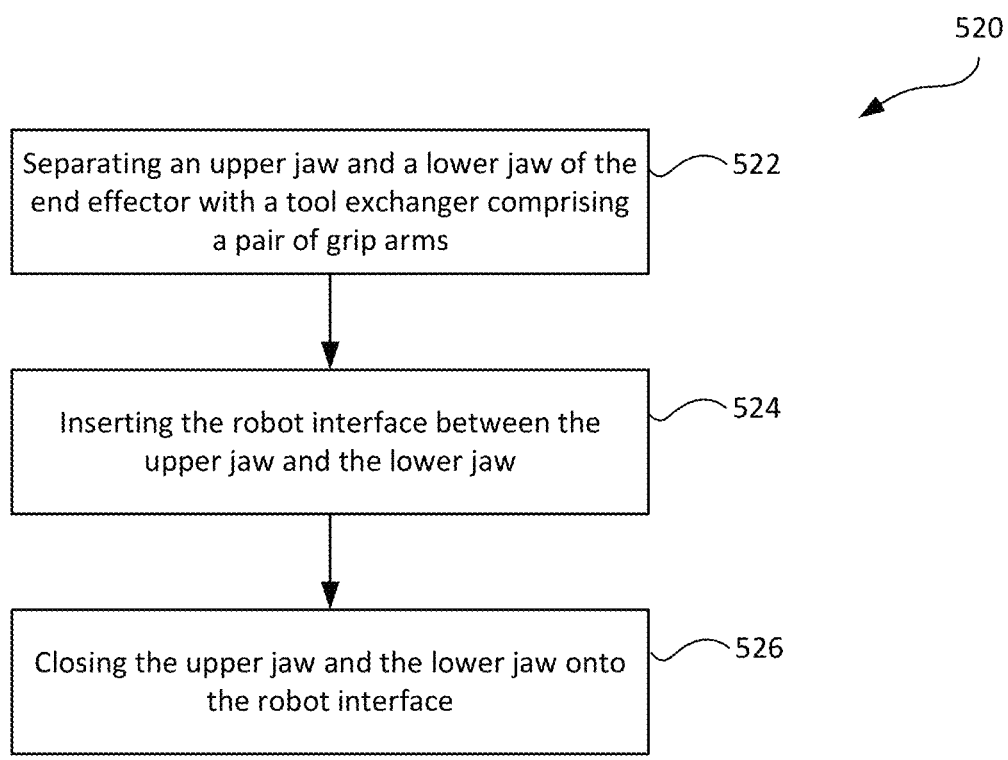
FIG. 15 is a flowchart of a method according to another embodiment of the present disclosure.

According to an embodiment of the present disclosure, step 520 may comprise the following steps, shown in FIG. 15.

At step 522, the upper jaw and the lower jaw are separated with a tool exchanger comprising a pair of grip arms. The pair of grip arms may comprise an upper grip arm and a lower grip arm. The upper grip arm and the lower grip arm may be configured to separate the upper jaw and the lower jaw. For example, an upper grip arm may contact the lower surface of the upper jaw, and a lower grip arm may contact an upper surface of the lower jaw. The tool exchanger may comprise a single pair of grip arms disposed on one side of the end effector or may comprise two pairs of grip arms disposed on opposite sides of the end effector.

At step 524, the robot interface is inserted between the upper jaw and the lower jaw. It should be understood that the pair of grip arms separate the upper jaw and the lower jaw in step 522 such that there is enough clearance to receive the robot interface in the end effector. The amount of clearance required may depend on the geometry of the end effector and the robot interface. When the robot interface is inserted between the upper jaw and the lower jaw, the robot arm may move the robot interface in an axial direction. The robot arm may also move the robot interface in the second direction in order to align with the upper jaw and the lower jaw.

At step 526, the upper jaw and the lower jaw are closed onto the robot interface. The pair of grip arms of the tool exchanger may be configured to close the upper jaw and the lower jaw of the end effector onto the robot interface. The end effector may comprise a spring connected to the upper jaw and the lower jaw, and the spring may urge the upper jaw and the lower jaw together. Accordingly, the spring may cause the upper jaw and the lower jaw to close onto the robot interface with or without a corresponding movement of the pair of grip arms.

One or more kinematic couplings may be provided between the end effector and the robot interface. The kinematic couplings may engage one another at step 526, when the upper jaw and the lower jaw are closed onto the robot interface. When the kinematic couplings are engaged, the end effector and the robot interface may be prevented from moving relative to one another (i.e., the end effector and the robot interface may be constrained in all six degrees of freedom). The one or more kinematic couplings may include contacts between a spherical or hemispherical feature of one of the end effector and the robot interface and a tetrahedral groove, a cone-shaped groove, a v-shaped groove, or a flat groove of the other of the end effector and the robot interface. It should be understood that in order to constrain all six degrees of freedom, the kinematic couplings may provide at least six contact points between the end effector and the robot interface. The six contact points may be established by a combination of one or more of a tetrahedral groove (three contact points), a v-shaped groove (two contact points), or a flat groove (one contact point). Alternatively, the kinematic couplings may provide an annular contact between the end effector and the robot interface with a cone-shaped groove.

According to an embodiment of the present disclosure, the tool exchanger is disposed in a garage. Thus, step 522 may comprise separating the upper jaw and the lower jaw with the pair of grip arms when the end effector is positioned in the garage. The garage may be configured to store one or more end effectors. For example, the garage may include one or more platforms, and one end effector may be disposed on each platform. The one or more platforms may be arranged vertically within the garage. The tool exchanger may be vertically movable within the garage. When the end effector is positioned in the garage, the pair of grip arms may be configured to separate the upper jaw and the lower jaw. For example, the pair of grip arms may be moved vertically within the garage, so as to align with the end effector. The pair of grip arms may also be moved inwardly/outwardly in order to engage with the upper jaw and the lower jaw. It should be understood that a combination of vertical movements and inward/outward movements of the pair of grip arms may be used to avoid contact with the end effector during vertical movement of the tool exchanger and/or to engage with the upper jaw and the lower jaw.

According to an embodiment of the present disclosure, the method 500 may further comprise, at step 515, detecting, by an optical sensor, when the end effector is positioned in the garage. It should be understood that step 515 may be performed before step 520 in order to detect when the end effector is positioned in the garage to complete tool exchanging and/or to detect which platforms in the garage are occupied with end effectors. Step 515 may also be performed after step 520 in order to detect which platforms in the garage are not occupied with end effectors.

According to an embodiment of the present disclosure, the method 500 may further comprise, at step 525, detecting, by a measurement sensor, a thickness of the end effector positioned in the garage. It should be understood that step 525 may be performed before step 520 in order to detect which type of end effector is stored on a platform in the garage. Step 525 may also be performed after step 520 in order to confirm that the end effector is properly coupled to the robot arm via the robot interface.

The optical sensor and the measurement sensor may be in electronic communication with a processor. The processor may be configured to control the robot arm and/or the tool exchanger based on information received from the optical sensor and/or the measurement sensor.

It should be understood that while the method 500 is described with respect to components of the system 100, the method 500 may also be applied to systems 200, 300, and 400 described herein, and any changes or modifications to the method 500 to apply to the components of systems 200, 300, and 400 are considered to be within the scope of the present disclosure.

With the method 500, a method for selectively coupling an end effector to a robot arm is provided that may provide several advantages compared to the related art. For example, the end effector may be lightweight, so as not to affect robot speed or system throughput. The end effector may also be compact, so as not to limit the robot envelope. The end effector may be robot agnostic, so as to integrate with existing and new robot arms. The end effector may also be externally actuated, so as not to require integration with the robot arm and to allow safety checks to ensure proper coupling. The method 500 may be cleanroom compatible, by producing low particulates (e.g., less than 45 nm particles) when performing tool exchanging.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:
1. A method comprising:
disposing a robot interface on a robot arm;
selectively coupling an end effector to the robot arm via the robot interface, wherein the end effector comprises an upper jaw and a lower jaw, the upper jaw and the lower jaw being spaced apart in a first direction and biased together; and disposing a substrate on a pair of arms of the end effector, the pair of arms being spaced apart in a second direction orthogonal to the first direction;

wherein when the end effector is coupled to the robot arm, the robot interface is disposed between the upper jaw and the lower jaw.

2. The method of claim 1, wherein the end effector further comprises a spring connected to the upper jaw and the lower jaw, and the spring is pre-loaded to urge the upper jaw and the lower jaw together.

3. The method of claim 1, wherein a first kinematic coupling is provided between an upper surface of the lower jaw and a lower surface of the robot interface.

4. The method of claim 3, wherein a second kinematic coupling is provided between a lower surface of the upper jaw and an upper surface of the robot interface.

5. The method of claim 1, wherein the end effector further comprises a plunger and the robot interface further comprises a plunger socket, and when the end effector is coupled to the robot arm, the plunger is coupled to the plunger socket and is movable in an axial direction by the robot arm.

6. The method of claim 1, wherein selectively coupling the end effector to the robot arm via the robot interface comprises:

separating the upper jaw and the lower jaw with a tool exchanger comprising a pair of grip arms;

inserting the robot interface between the upper jaw and the lower jaw; and closing the upper jaw and the lower jaw onto the robot interface.

7. The method of claim 6, wherein the tool exchanger is disposed in a garage, and separating the upper jaw and the lower jaw with the tool exchanger comprising the pair of grip arms comprises:

separating the upper jaw and the lower jaw with the pair of grip arms when the end effector is positioned in the garage.

8. The method of claim 7, further comprising detecting, by an optical sensor, when the end effector is positioned in the garage.

9. The method of claim 7, further comprising detecting, by a measurement sensor, a thickness of the end effector positioned in the garage.

* * * * *